(12) United States Patent　　　(10) Patent No.: US 9,490,771 B2
Burak et al.　　　　　　　　　　　　(45) Date of Patent: *Nov. 8, 2016

(54) ACOUSTIC RESONATOR COMPRISING COLLAR AND FRAME

(71) Applicant: Avago Technologies General IP (Singapore) Pte. Ltd., Singapore (SG)

(72) Inventors: Dariusz Burak, Fort Collins, CO (US); John Choy, Westminster, CO (US); Alexandre Shirakawa, San Jose, CA (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 360 days.

This patent is subject to a terminal disclaimer.

(21) Appl. No.: 13/781,491

(22) Filed: Feb. 28, 2013

(65) Prior Publication Data

US 2014/0118087 A1　　May 1, 2014

Related U.S. Application Data

(63) Continuation-in-part of application No. 13/663,449, filed on Oct. 29, 2012.

(51) Int. Cl.
*H03H 9/17*　　　(2006.01)
*H03H 9/02*　　　(2006.01)
(Continued)

(52) U.S. Cl.
CPC ...... *H03H 9/02118* (2013.01); *H03H 9/02157* (2013.01); *H03H 9/132* (2013.01); *H03H 9/171* (2013.01); *H03H 9/173* (2013.01); *H03H 9/54* (2013.01); *H03H 9/584* (2013.01)

(58) Field of Classification Search
CPC ...... H03H 9/132; H03H 9/171; H03H 9/173; H03H 9/584; H03H 9/02118; H03H 9/02157; H03H 9/54

USPC .................. 333/133, 186–191; 310/324, 365
See application file for complete search history.

(56) References Cited

U.S. PATENT DOCUMENTS 4,633,285 A　　12/1986　Hunsinger et al.
4,916,520 A　　4/1990　Kurashima
(Continued)

FOREIGN PATENT DOCUMENTS

CN　　101170303　　4/2008
EP　　0880227　　11/1998
(Continued)

OTHER PUBLICATIONS

"Co-pending U.S. Appl. No. 13/662,425, filed Oct. 27, 2012".
"Co-pending U.S. Appl. No. 13/036,489, filed Feb. 28, 2011".
"Co-pending U.S. Appl. No. 13/074,094, filed Mar. 29, 2011".
(Continued)

*Primary Examiner* — Barbara Summons
*Assistant Examiner* — Jorge Salazar, Jr.

(57) ABSTRACT

An acoustic resonator structure comprises a first electrode disposed on a substrate, a piezoelectric layer disposed on the first electrode, a second electrode disposed on the piezoelectric layer, a frame disposed within a main membrane region defined by an overlap between the first electrode, the piezoelectric layer, and the second electrode, and having an outer edge substantially aligned with a boundary of the main membrane region, and a collar formed separate from the frame, disposed outside the main membrane region, and having an inner edge substantially aligned with the boundary of or overlapping the main membrane region.

25 Claims, 19 Drawing Sheets

(51) Int. Cl.
*H03H 9/13* (2006.01)
*H03H 9/54* (2006.01)
*H03H 9/58* (2006.01)

(56) References Cited

U.S. PATENT DOCUMENTS

| | | | |
|---|---|---|---|
| 4,933,743 | A | 6/1990 | Thomas |
| 5,006,478 | A | 4/1991 | Kobayashi |
| 5,087,959 | A | 2/1992 | Omori et al. |
| 5,587,620 | A | 12/1996 | Ruby et al. |
| 5,698,928 | A | 12/1997 | Mang et al. |
| 5,817,446 | A | 10/1998 | Lammert |
| 5,825,092 | A | 10/1998 | Eelgado et al. |
| 5,873,153 | A | 2/1999 | Ruby et al. |
| 6,107,721 | A | 8/2000 | Lakin |
| 6,291,931 | B1 | 9/2001 | Lakin |
| 6,384,697 | B1 | 5/2002 | Ruby |
| 6,395,618 | B2 | 5/2002 | Vergani et al. |
| 6,396,200 | B2 | 5/2002 | Misu et al. |
| 6,424,237 | B1 | 7/2002 | Ruby et al. |
| 6,476,536 | B1 * | 11/2002 | Pensala ............. H03H 3/013 310/312 |
| 6,507,983 | B1 | 1/2003 | Ruby et al. |
| 6,548,943 | B2 | 4/2003 | Kaitila et al. |
| 6,607,934 | B2 | 8/2003 | Chang et al. |
| 6,617,751 | B2 | 9/2003 | Sunwoo et al. |
| 6,709,776 | B2 | 3/2004 | Noguchi et al. |
| 6,767,757 | B2 | 7/2004 | Kang et al. |
| 6,864,619 | B2 | 3/2005 | Aigner et al. |
| 6,927,649 | B2 | 8/2005 | Metzger et al. |
| 6,936,837 | B2 | 8/2005 | Yamada et al. |
| 6,985,051 | B2 | 1/2006 | Nguyen et al. |
| 6,987,433 | B2 | 1/2006 | Larson et al. |
| 7,019,605 | B2 | 3/2006 | Larson et al. |
| 7,084,553 | B2 | 8/2006 | Ludwiczak et al. |
| 7,091,649 | B2 | 8/2006 | Larson et al. |
| 7,123,119 | B2 | 10/2006 | Pashby et al. |
| 7,161,447 | B2 | 1/2007 | Nomura et al. |
| 7,161,448 | B2 | 1/2007 | Feng et al. |
| 7,173,504 | B2 | 2/2007 | Larson et al. |
| 7,199,683 | B2 | 4/2007 | Thalhammer |
| 7,230,509 | B2 | 6/2007 | Stoemmer et al. |
| 7,230,511 | B2 | 6/2007 | Onishi |
| 7,233,218 | B2 | 6/2007 | Park et al. |
| 7,242,270 | B2 | 7/2007 | Larson et al. |
| 7,275,292 | B2 | 10/2007 | Ruby et al. |
| 7,280,007 | B2 | 10/2007 | Feng et al. |
| 7,295,088 | B2 | 11/2007 | Nguyen et al. |
| 7,310,874 | B2 | 12/2007 | Higuchi et al. |
| 7,332,985 | B2 | 2/2008 | Larson et al. |
| 7,345,410 | B2 | 3/2008 | Grannen et al. |
| 7,353,707 | B2 | 4/2008 | Mikado et al. |
| 7,358,831 | B2 | 4/2008 | Larson, III et al. |
| 7,362,198 | B2 | 4/2008 | Larson et al. |
| 7,365,619 | B2 | 4/2008 | Aigner et al. |
| 7,367,095 | B2 | 5/2008 | Larson et al. |
| 7,377,168 | B2 | 5/2008 | Liu |
| 7,385,835 | B2 | 6/2008 | Leedy |
| 7,388,454 | B2 | 6/2008 | Ruby et al. |
| 7,388,455 | B2 | 6/2008 | Larson et al. |
| 7,391,285 | B2 | 6/2008 | Larson et al. |
| 7,391,286 | B2 | 6/2008 | Jamneala et al. |
| 7,400,217 | B2 | 7/2008 | Larson et al. |
| 7,408,428 | B2 | 8/2008 | Larson et al. |
| 7,423,503 | B2 | 9/2008 | Larson et al. |
| 7,425,787 | B2 | 9/2008 | Larson et al. |
| 7,427,819 | B2 | 9/2008 | Hoen et al. |
| 7,456,497 | B2 | 11/2008 | Higashi |
| 7,459,990 | B2 | 12/2008 | Wunnicke et al. |
| 7,466,213 | B2 | 12/2008 | Lobl et al. |
| 7,468,608 | B2 | 12/2008 | Feucht et al. |
| 7,486,213 | B2 | 2/2009 | Yu et al. |
| 7,514,844 | B2 | 4/2009 | Unkrich et al. |
| 7,515,018 | B2 | 4/2009 | Handtmann et al. |
| 7,525,398 | B2 | 4/2009 | Nishimura |
| 7,535,154 | B2 | 5/2009 | Umeda |
| 7,554,166 | B2 | 6/2009 | Wei et al. |
| 7,562,429 | B2 | 7/2009 | Larson et al. |
| 7,575,292 | B2 | 8/2009 | Furukawa |
| 7,586,392 | B2 | 9/2009 | Unkrich et al. |
| 7,600,371 | B2 | 10/2009 | Sternberger et al. |
| 7,612,636 | B2 | 11/2009 | Jamneala et al. |
| 7,616,079 | B2 | 11/2009 | Tikka et al. |
| 7,629,865 | B2 | 12/2009 | Ruby |
| 7,636,026 | B2 | 12/2009 | Heinze et al. |
| 7,642,693 | B2 | 1/2010 | Akiyama et al. |
| 7,675,390 | B2 | 3/2010 | Larson et al. |
| 7,758,979 | B2 | 7/2010 | Akiyama et al. |
| 7,791,434 | B2 | 9/2010 | Fazzio et al. |
| 7,795,781 | B2 | 9/2010 | Barber et al. |
| 7,825,747 | B2 | 11/2010 | Fattinger et al. |
| 7,825,749 | B2 | 11/2010 | Thalhammer et al. |
| 7,889,024 | B2 | 2/2011 | Bradley et al. |
| 7,966,722 | B2 | 6/2011 | Hart et al. |
| 7,986,075 | B2 | 7/2011 | Asai et al. |
| 7,986,198 | B2 | 7/2011 | Nakatsuka et al. |
| 8,003,520 | B2 | 8/2011 | Bonilla et al. |
| 8,008,993 | B2 | 8/2011 | Milsom et al. |
| 8,018,303 | B2 | 9/2011 | Handtmann et al. |
| 8,030,823 | B2 | 10/2011 | Sinha et al. |
| 8,084,794 | B2 | 12/2011 | Kamada |
| 8,084,919 | B2 | 12/2011 | Nishihara et al. |
| 8,120,066 | B2 | 2/2012 | Lanzieri et al. |
| 8,222,795 | B2 | 7/2012 | Sinha |
| 8,253,513 | B2 | 8/2012 | Zhang |
| 8,258,894 | B2 | 9/2012 | Thalhammer et al. |
| 8,283,835 | B2 | 10/2012 | Metzger et al. |
| 8,330,325 | B1 | 12/2012 | Burak et al. |
| 8,384,497 | B2 | 2/2013 | Zhang et al. |
| 8,507,919 | B2 | 8/2013 | Ishikura |
| 8,575,820 | B2 | 11/2013 | Shirakawa et al. |
| 8,610,516 | B2 | 12/2013 | Umeda et al. |
| 8,642,485 | B2 | 2/2014 | Lin et al. |
| 8,692,631 | B2 | 4/2014 | Zhang |
| 8,718,112 | B2 | 5/2014 | Mahrt |
| 8,735,911 | B2 | 5/2014 | Sakai |
| 8,872,604 | B2 | 10/2014 | Burak |
| 8,896,395 | B2 | 11/2014 | Burak |
| 9,041,128 | B2 | 5/2015 | Dunbar |
| 9,083,302 | B2 | 7/2015 | Burak et al. |
| 9,148,117 | B2 | 9/2015 | Burak et al. |
| 2002/0153965 | A1 | 10/2002 | Ruby et al. |
| 2004/0046622 | A1 | 3/2004 | Aigner et al. |
| 2004/0092234 | A1 | 5/2004 | Pohjonen |
| 2004/0099898 | A1 | 5/2004 | Grivna et al. |
| 2004/0124952 | A1 | 7/2004 | Tikka |
| 2004/0129079 | A1 | 7/2004 | Kato et al. |
| 2004/0150293 | A1 | 8/2004 | Unterberger |
| 2004/0150296 | A1 | 8/2004 | Park et al. |
| 2004/0166603 | A1 | 8/2004 | Carley |
| 2004/0195937 | A1 | 10/2004 | Matsubara et al. |
| 2004/0212458 | A1 | 10/2004 | Lee |
| 2004/0246075 | A1 | 12/2004 | Bradley et al. |
| 2004/0257171 | A1 | 12/2004 | Park et al. |
| 2004/0257172 | A1 | 12/2004 | Schmidhammer et al. |
| 2004/0263287 | A1 | 12/2004 | Ginsburg et al. |
| 2005/0012570 | A1 | 1/2005 | Korden et al. |
| 2005/0012716 | A1 | 1/2005 | Mikulin et al. |
| 2005/0023931 | A1 | 2/2005 | Bouche et al. |
| 2005/0030126 | A1 | 2/2005 | Inoue et al. |
| 2005/0036604 | A1 | 2/2005 | Scott |
| 2005/0057117 | A1 | 3/2005 | Nakatsuka et al. |
| 2006/0087199 | A1 | 4/2006 | Larson et al. |
| 2006/0160353 | A1 | 7/2006 | Gueneau de Mussy et al. |
| 2006/0238070 | A1 | 10/2006 | Costa et al. |
| 2007/0035364 | A1 | 2/2007 | Sridhar et al. |
| 2007/0085213 | A1 | 4/2007 | Ahn et al. |
| 2007/0085632 | A1 | 4/2007 | Larson et al. |
| 2007/0205850 | A1 | 9/2007 | Jamneala et al. |
| 2008/0258842 | A1 | 10/2008 | Ruby et al. |
| 2009/0064498 | A1 | 3/2009 | Mok et al. |
| 2009/0102319 | A1 | 4/2009 | Nakatsuka et al. |
| 2010/0039000 | A1 | 2/2010 | Milson et al. |
| 2010/0107389 | A1 | 5/2010 | Nessler et al. |

(56) References Cited

U.S. PATENT DOCUMENTS

| | | | |
|---|---|---|---|
| 2010/0134209 A1* | 6/2010 | Gabl | G01N 29/022 333/187 |
| 2010/0148637 A1 | 6/2010 | Satou | |
| 2010/0327697 A1 | 12/2010 | Choy et al. | |
| 2010/0327994 A1 | 12/2010 | Choy et al. | |
| 2011/0121916 A1 | 5/2011 | Barber et al. | |
| 2011/0180391 A1 | 7/2011 | Larson, III et al. | |
| 2011/0204996 A1 | 8/2011 | Gilbert et al. | |
| 2011/0227671 A1 | 9/2011 | Zhang | |
| 2011/0266925 A1 | 11/2011 | Ruby et al. | |
| 2012/0177816 A1 | 7/2012 | Larson et al. | |
| 2012/0218060 A1 | 8/2012 | Burak et al. | |
| 2013/0038408 A1 | 2/2013 | Burak et al. | |
| 2013/0082799 A1 | 4/2013 | Zuo et al. | |
| 2013/0106534 A1 | 5/2013 | Burak et al. | |
| 2013/0127300 A1 | 5/2013 | Umeda et al. | |
| 2013/0155574 A1 | 8/2013 | Doolittle | |
| 2013/0205586 A1 | 8/2013 | Takada et al. | |
| 2013/0235001 A1 | 9/2013 | Yun et al. | |
| 2013/0241673 A1 | 9/2013 | Yokoyama et al. | |
| 2013/0314177 A1 | 11/2013 | Burak et al. | |
| 2014/0111288 A1 | 4/2014 | Nikkel et al. | |
| 2014/0118088 A1 | 5/2014 | Burak et al. | |
| 2014/0118091 A1 | 5/2014 | Burak et al. | |
| 2014/0118092 A1 | 5/2014 | Burak et al. | |
| 2014/0152152 A1 | 6/2014 | Burak | |
| 2014/0159548 A1 | 6/2014 | Burak | |
| 2014/0174908 A1 | 6/2014 | Feng | |
| 2014/0175950 A1 | 6/2014 | Zou | |
| 2014/0224941 A1 | 8/2014 | Gitter | |
| 2014/0225682 A1 | 8/2014 | Burak et al. | |
| 2014/0232486 A1 | 8/2014 | Burak | |

FOREIGN PATENT DOCUMENTS

| | | |
|---|---|---|
| GB | 2511919 | 9/2014 |
| JP | 10173479 | 6/1998 |
| JP | 2003-017964 | 1/2003 |
| JP | 2007208845 | 8/2007 |
| JP | 2008211394 | 9/2008 |
| JP | 4471443 | 6/2010 |
| KR | 20020050729 | 6/2002 |
| KR | 1020030048917 | 6/2003 |
| WO | 9937023 | 7/1999 |
| WO | 2005043752 | 5/2005 |
| WO | WO2006079353 | 8/2006 |
| WO | WO2007085332 | 8/2007 |
| WO | WO2013065488 | 5/2013 |

OTHER PUBLICATIONS

"Co-pending U.S. Appl. No. 13/074,262, filed Mar. 29, 2011".
"Co-pending U.S. Appl. No. 13/101,376, filed May 5, 2011".
"Co-pending U.S. Appl. No. 13/161,946, filed Jun. 16, 2011".
"Co-pending U.S. Appl. No. 13/286,038, filed Oct. 31, 2011".
"Co-pending U.S. Appl. No. 13/662,460, filed Oct. 27, 2012".
"Co-pending U.S. Appl. No. 13/766,993, filed Feb. 14, 2013".
"Co-pending U.S. Appl. No. 13/767,754, filed Feb. 14, 2013".
"Co-pending U.S. Appl. No. 13/781,491, filed Feb. 28, 2013".
"Co-pending U.S. Appl. No. 13/955,744, filed Jul. 31, 2013".
Aigner, Robert, "SAW, BAW and the Future of Wireless", May 6, 2013, pp. 1-4.
El Hassan, M. et al., "Techniques for Tuning BAW-SMR Resonators for the 4th Generation of Mobile Communications", *Intech* 2013, 421-442.
Lee, et al., "Development of High-Quality FBAR Devices for Wireless Applications Employing Two-Step Annealing Treatments", *IEEE Microwave and Wireless Components Letters*, vol. 21, No. 11 Nov. 2011.
Pensala, Tuomas, "Thin Film Bulk Acoustic Wave Devices: Performance Optimization and Modeling", *VTT Publications 756*, http://www.vtt.fi/inf/pdf/publications/2011/P756.pdf, 1-108.
Pineda, Humberto, "Thin-Film Bulk Acoustic Wave Resonators—FBAR", Bellaterra, Monpelier Dec. 2007, 1-241.
Tang, et al., "Micromachined Bulk Acoustic Resonator With a Raised Frame", *16th International Conference on Mechatronics Technology*, Oct. 16-19 2012, Tianjin, China Oct. 16-19, 2012.
Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012
G.W. Archibald "Experimental results of bulk acoustic wave transverse graded electrode patterns", Proceedings of the 1998 IEEE International Frequency Control Symposium, Publication Year: 1998, pp. 477-483.
Kazuhiko Kano, et al., "Enhancement of Piezoelectric Response in Scandium Aluminum Nitride Alloy Thin Films prepared by Dual Reactive Co-Sputtering", vol. 17, 2012.
Milena Moriera, et al. "Aluminum scandium nitride thin-film bulk acoustic resonators for wide band applications", Vacuum 86 (2011) 23-26.
Kerherve, "BAW Technologies for Radiofrequency Filters and Duplexers", Nov. 2011.
Lin, "Temperature Compensation of Aluminum Nitride Lamb Wave Resonators Utilizing the Lowest-Order Symmetric Mode", Electrical Engineering and Computer Sciences University of California at Berkeley, Dec. 14, 2012.
Umeda et al, "Piezoelectric Properties of ScAlN Thin Films for Piezo-MEMS Devices", MEMS 2013, Taipei, Taiwan, Jan. 20-24, 2013, pp. 733-736.
Office Action mailed Mar. 4, 2015 in U.S. Appl. No. 13/663,449.
Pandey et al., "Anchor Loss Reduction in Resonant MEMS using MESA Structures", Proceedings of the 2nd IEEE International Conference on Nano/Micro Engineered and Molecular Systems, Bangkok, Thailand, Jan. 16-19 2007, p. 880-885.
Tas et al., "Reducing Anchor Loss in Micromechanical Extensional Mode Resonators", IEEE Transactions on Ultrasonics, Ferroelectrics, and Frequency Control, vol. 57, No. 2, Feb. 2010, p. 448-454.
IEEE Xplore Abstract for "Suppression of Acoustic Energy Leakage in FBARs with Al Bottom Electrode: FEM Simulation and Experimental Results", 2007 IEEE Ultrasonics Symposium, Oct. 28-31, 2007, 1657-1660.
Ohara et al., "Suppression of Acoustic Energy Leakage in FBARS with Al Bottom Electrode: FEM Simulation and Experimental Results", 2007 IEEE Ultrasonics Symposium, Oct. 28-31, 2007, 1657-1660.
Office Action mailed Jan. 28, 2015 in U.S. Appl. No. 13/658,024.
A.C. Lynch, "Precise measurements on dieletric and magnetic materials", IEEE Transactions on Instrumentation and Measurement, vol. IM-23, No. 4, Dec. 1974, p. 425-431.
Ranjan et al., "Strained Hexagonal ScN: A Material with Unusual Structural and Optical Properties", Physical Review Letters, Jun. 27, 2003, vol. 90, No. 25, The American Physical Society, USA.
Farrer et al., "Properties of hexagonal ScN versus wurtzite GaN and InN," Physical Review B, Nov. 20, 2002, vol. 66, No. 20, The American Physical Society, USA.
Constantin et al., "Composition-dependent structural properties in ScGaN alloy films: A combined experimental and theoretical study," Journal of Applied Physics, Dec. 16, 2005, vol. 98, No. 12, American Institute of Physics, USA.
Akiyama et al., "Enhancement of piezoelectric response in scandium aluminum nitride alloy thin films prepared by dual reactive cosputtering," Advanced Materials, 2009, vol. 21, pp. 593-596, Japan.
Suzuki et al., "Influence of shadowing effect on shear mode acoustic properties in the c-axis tilted AlN films," IEEE Ultrasonics Symposium (IUS), 2010, pp. 1478-1481.
Yanagitani et al., "Giant shear mode electromechanical coupling coefficient k12 in c-axis tilted ScAlN films," IEEE Ultrasonics Symposium (IUS), 2010.

\* cited by examiner

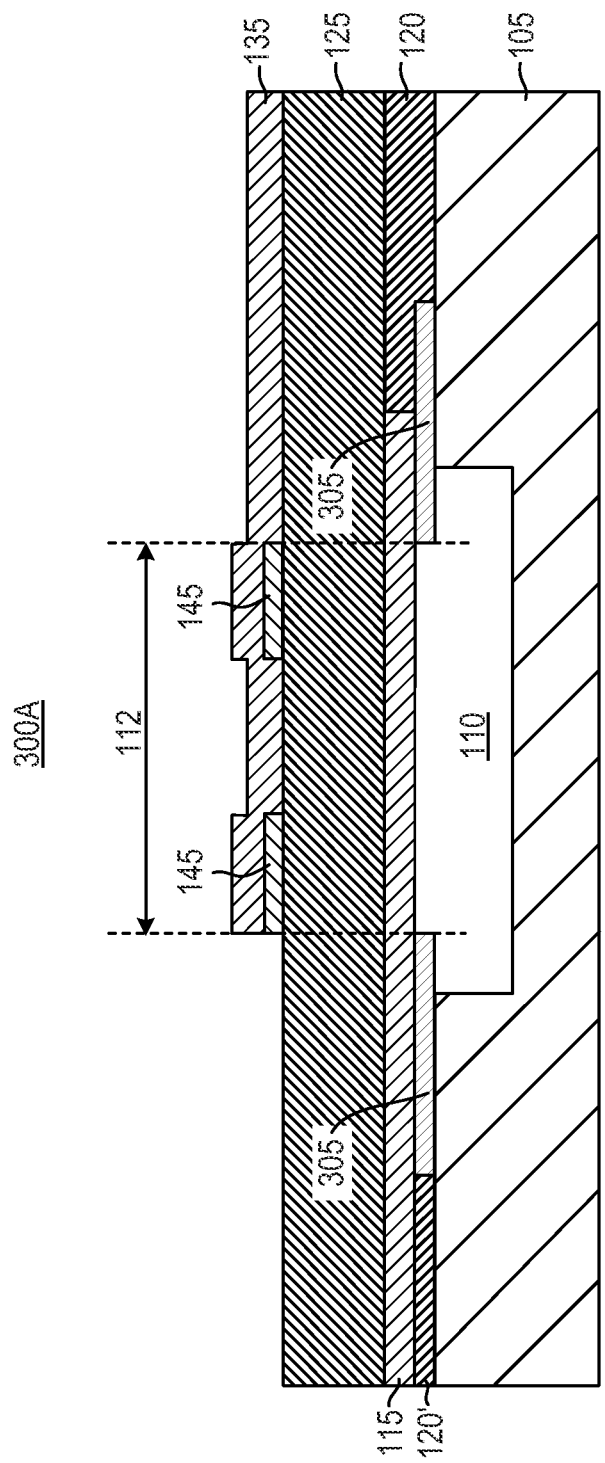

ACOUSTIC RESONATOR COMPRISING COLLAR AND FRAME

CROSS REFERENCE TO RELATED APPLICATIONS

This application is a continuation-in-part under 37 CFR, 1.53(b) of commonly owned U.S. patent application Ser. No. 13/663,449 entitled "Acoustic Resonator Having Collar Structure," filed on Oct. 29, 2012, the subject matter of which is hereby incorporated by reference.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), double bulk acoustic resonators (DBARs), and solidly mounted resonators (SMRs).

An acoustic resonator typically comprises a layer of piezoelectric material sandwiched between two plate electrodes in a structure referred to as an acoustic stack. Where an input electrical signal is applied between the electrodes, the reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region.

The lateral modes facilitate continuity of appropriate mechanical particle velocities and stresses between the main membrane region and the peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, a collar may be formed by a dielectric material outside the boundary of the main membrane region to allow a smooth decay of evanescent modes emanating from the boundary and improve confinement of mechanical motion to the main membrane region. In another example a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has several potential shortcomings. For instance, depending on their specific design, they may be a source of additional scattering of the piston mode which may outweigh their benefits. Additionally, they may require the presence of certain additional materials that can deleteriously redistribute the acoustic energy in the acoustic stack, such as relatively soft planarization layers. Also, some design choices may produce only modest performance improvements white significantly driving up cost. Moreover, the formation of ancillary structural features may degrade structural stability or interfere with the formation of overlying layers. Accordingly, in view of these and other shortcomings of conventional acoustic resonator structures, there is a general need for improved acoustic resonator designs.

SUMMARY

In a representative embodiment, an acoustic resonator structure comprises a first electrode disposed on a substrate, a piezoelectric layer disposed on the first electrode, a second electrode disposed on the piezoelectric layer, a frame disposed within a main membrane region defined by an overlap between the first electrode, the piezoelectric layer, and the second electrode, and having an outer edge substantially aligned with a boundary of the min membrane region, and a collar formed separate from the frame, disposed outside the main membrane region, and having an inner edge substantially aligned with the boundary of or overlapping the main membrane region.

In another representative embodiment, an acoustic resonator structure comprises an acoustic stack comprising a piezoelectric layer sandwiched between first and second electrode layers and having a main membrane region defined by an overlap between the first electrode, the piezoelectric layer, and the second electrode, a frame disposed within the main membrane region and having an outer edge substantially aligned with a boundary of the main membrane region, and a collar disposed outside the main membrane region and having an inner edge substantially aligned with the boundary of or overlapping the main membrane region, wherein the frame and the collar are located at different layers of the acoustic stack.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 3A is a cross-sectional view of an acoustic resonator according to another representative embodiment.

DETAILED DESCRIPTION

Figure 1A:
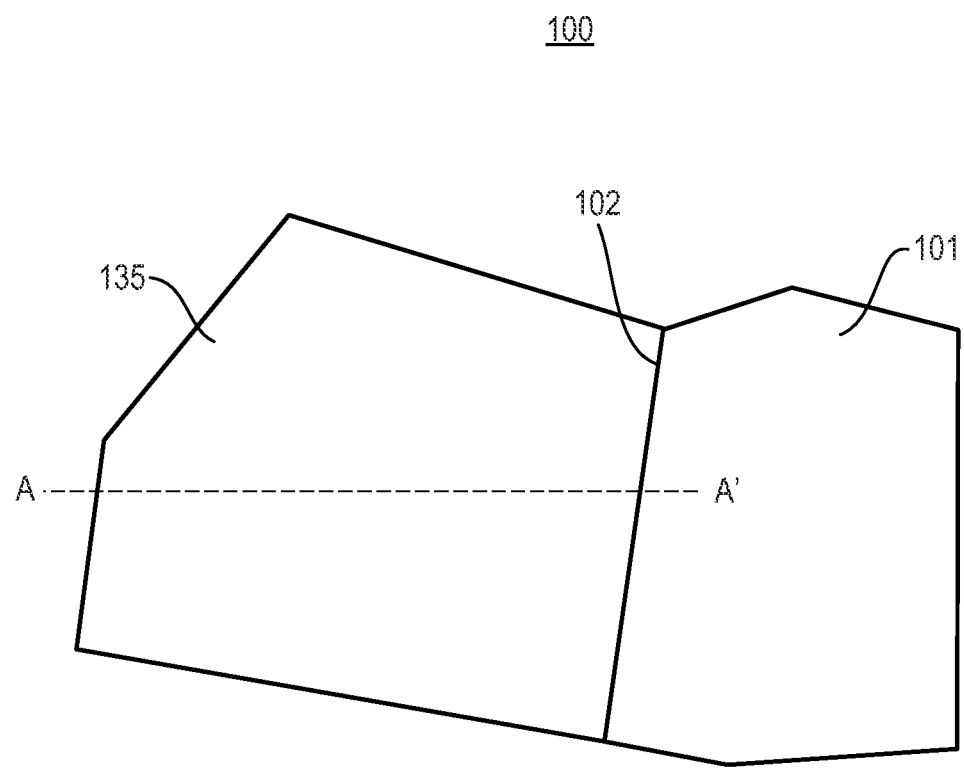
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "tower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such em film bulk acoustic wave resonators (FBARs) or solidly mounted resonators (SMRs). Certain details of acoustic resonators, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkei et al.; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S. Pat. No. 6,548,943 to Kaitila et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

In certain embodiments described below, an acoustic resonator comprises a piezoelectric layer disposed between top and bottom electrodes, a collar disposed outside a main membrane region, and a frame disposed within the main membrane region. The collar typically has an inner edge substantially aligned with a boundary of the main membrane region or somewhat overlapping the main membrane region, and the frame typically has an outer edge substantially aligned with the boundary of the main membrane region.

The collar is usually formed of a relatively thick dielectric region of finite width, and it can be located in various alternative locations, such as above the top electrode, below the bottom electrode, or between the bottom electrode and the piezoelectric layer. The collar can also be split into several layers and formed in more than one of the above locations. Also, the collar may be formed inside other features of the acoustic resonator, for instance inside the piezoelectric layer. A region of the acoustic resonator above and below the collar will be referred to as a collar region.

The collar is typically designed so that its cut-off frequency is substantially the same as the cutoff frequency in the main membrane region, and its main non-propagating mode (evanescent triode, for instance) has substantially the same modal distribution as the piston mode in the main membrane region. This prevents acoustic energy in the piston mode from being converted into unwanted propagating modes in the collar region and propagating and evanescent modes in the main membrane region. If excited, propagating modes in the collar region in general may lead to energy loss due to acoustic radiation to the region outside of acoustic resonator. Similarly, if excited, propagating and evanescent modes inside the main membrane region may in general produce lateral voltage gradients, which may lead to lateral current flows and energy loss due to the Joule heating. Thus, the collar may improve confinement of the piston mode within the main membrane region white suppressing the excitation of unwanted spurious lateral modes inside and outside of the main membrane region. This, in turn, may reduce overall acoustic scattering loss and enhance the parallel resistance Rp and the quality factor Q of the acoustic resonator.

In the absence of the collar, there may be a significant acoustic impedance discontinuity at the edge of the top electrode for an electrically excited piston mode. Because the electric field is also terminated at the edge of top electrode, that edge will cause both mechanical and electrical excitation of evanescent, propagating and complex modes supported by the structures both inside and outside of the main membrane region. Thus, in the presence of properly designed collar, most of the piston mode energy at the top electrode edge may couple to the evanescent triode in the collar region, which may then decay exponentially and become efficiently suppressed inside a wide enough collar structure. Moreover, some propagating modes may be suppressed by forming the collar structure with a proper width.

The frame is formed by adding a layer of material, usually an electrically conducting material (although dielectric material is possible as well), to the top or bottom electrode. The frame can be either a composite frame or an add-on frame. An add-on frame is formed by depositing the material above or below of a layer forming either the bottom or top electrode along a perimeter of the main membrane region. A composite frame is formed by embedding the material within the top or bottom electrode, typically with an exposed upper or lower surface being coplanar with an upper or lower surface of the top or bottom electrode. The use of a composite frame can simplify fabrication of the acoustic resonator with regard to application of layers on planar surfaces. For instance, it can prevent the formation of outcroppings in overlying layers, which can preserve the structural stability of the acoustic resonator. A region of the acoustic resonator above and below the frame will be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cut-off frequency mismatch and an acoustic impedance mismatch between the frame region and other portions of the main membrane region. A frame that lowers (or increases) the cut-off frequency in the frame region as compared to the main membrane region will be referred to as a Low Velocity Frame (or a High Velocity Frame), or LVF (HVF). The reasoning behind this nomenclature is that for composite frames (for which thicknesses of the frame and main membrane regions are substantially the same), an increase or decrease of the cut-off frequency is substantially equivalent to an increase or decrease an effective sound velocity of the stack forming the frame, respectively.

A composite or add-on frame with lower sound velocity than the corresponding sound velocity of a main membrane (i.e., an LVF) generally increases parallel resistance Rp and quality factor Q of the acoustic resonator above the cut-off frequency of the main membrane region. Conversely, a composite or add-on frame with a higher sound velocity than the corresponding sound velocity of a main membrane (i.e., an HVF) generally decreases series resistance Rs and increases quality factor Q of the acoustic resonator below the cut-off frequency of the main membrane region. A typical low velocity frame, for example, effectively provides a region with significantly lower cut-off frequency than the main membrane region and therefore minimizes the amplitude of the electrically excited piston mode towards the edge of the top electrode in the frame region, as described in further detail with reference to FIG. 7B below. Furthermore, it provides two interfaces (impedance miss-match planes), which increase reflection of propagating eigenmodes. These propagating eigenmodes are mechanically excited at membrane/frame interface, and both mechanically and electrically excited at the top electrode edge. Where the width of the frame is properly designed for a given eigenmode, it results in resonantly enhanced suppression of that particular eigenmode. In addition, a sufficiently wide tow velocity frame provides a region for smooth decay of the evanescent and complex modes, which are excited by similar mechanisms as the propagating eigenmodes. The combination of the above effects yields better energy confinement and higher quality factor Q at a parallel resonance frequency Fp.

Various examples of collars and frames, as well as related materials and operating characteristics, are described in the above cited U.S. patent application Ser. Nos. 13/663,449 and 13/660,941 to Burak et al. As explained in those applications, collars and frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, series resistance Rs, parallel resistance Rp, or electromechanical coupling coefficient $Kt^2$. Although the following description presents several embodiments in the form of FBAR devices, several of the described concepts could be implemented in other forms of acoustic resonators, such as SMRs, for example.

FIG. 1A is a top view of an acoustic resonator 100 according to a representative embodiment, and FIGS. 1B-1E are cross-sectional views of acoustic resonator 100, taken along a line A-A'. The cross-sectional views correspond to different variations of acoustic resonator 100 and will be referred to, respectively, as acoustic resonators 100B-100E. Acoustic resonators 100B-100E have many of the same features, so a repetitive description of these features may be omitted in an effort to avoid redundancy.

Referring to FIG. 1A, acoustic resonator 100 comprises atop electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator 100.

Figure 1B:
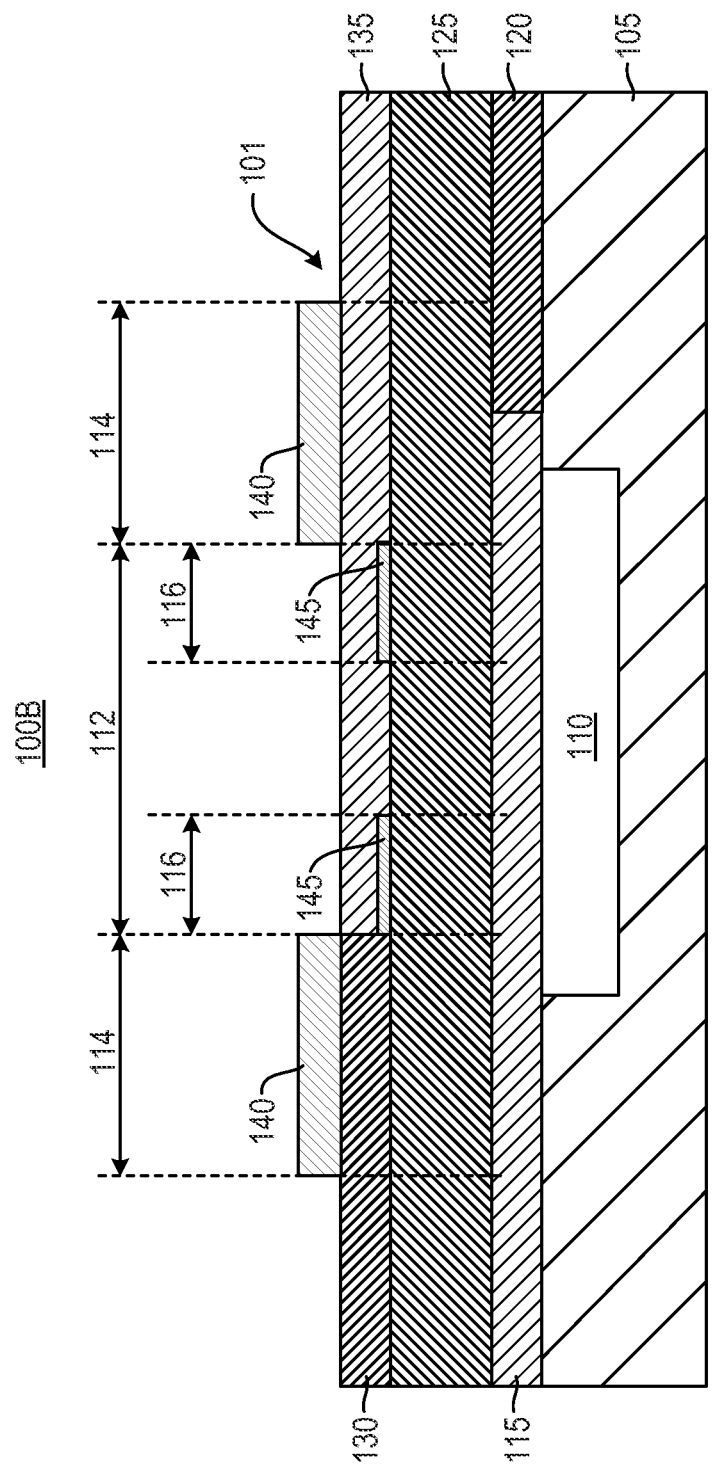
FIG. 1B is a cross-sectional view of an acoustic resonator according to a representative embodiment.

Referring to FIG. 1B, acoustic resonator 100B comprises a substrate 105 having an air cavity 110, a bottom electrode 115 disposed on substrate 105 over air cavity 110, a first planarization layer 120 disposed on substrate 105 adjacent to bottom electrode 115, a piezoelectric layer 125 disposed on first electrode 115 and first planarization layer 120, atop electrode 135 disposed on piezoelectric layer 125, and a second planarization layer 130 disposed on piezoelectric layer 125 adjacent to top electrode 135. Collectively, bottom electrode 115, piezoelectric layer 125, and top electrode 135 constitute an acoustic stack of acoustic resonator 100B. Acoustic resonator 100B further comprises a collar 140 disposed on second planarization layer 130 and top electrode 135, and a frame 145 disposed in a bottom portion of top electrode 135. Although not shown, a passivation layer may be present on top of the top electrode 135 with thickness sufficient to insulate all layers of the resonator stack from the environment, including protection from moisture, corrosives, contaminants, debris and the like.

Substrate 105 may be formed of a material compatible with semiconductor processes, such as silicon (Si), gallium arsenide (GaAs), indium phosphide (InP), glass, sapphire, alumina, or the like, for example. Various illustrative fabrication techniques for an air cavity in a substrate are described by U.S. Pat. No. 7,345,410 (Mar. 18, 2008) to Grannen et al., and various illustrative fabrication techniques of acoustic mirrors are described by in U.S. Pat. No. 7,358,831 (Apr. 15, 2008), to Larson III, et al., which are hereby incorporated by reference in their entirety. Although substrate 105 is shown with air cavity 110, it could alternatively include an acoustic reflector such as Distributed Bragg Reflector, for example.

First and second planarization layers 120 and 130 are typically formed of borosilicate glass (BSG), for example. The first planarization layer 120 is not strictly required for the functioning of FBAR 100B, but its presence can confer various benefits. For instance, the presence of bottom planarization layer 120 tends to improve the structural stability of FBAR 400, it can improve the quality of growth of subsequent layers, and it may allow bottom electrode 115 to be formed without its edges extending beyond the air cavity 110. Further examples of potential benefits of planarization are presented in U.S. patent application Ser. No. 13/286,038 filed Oct. 31, 2011, the subject matter of which is hereby incorporated by reference. Bottom and top electrodes 115 and 135 are typically formed of one or more electrically conductive metal materials, such as tungsten (W), molybdenum (Mo), copper (Cu) or aluminum (Al). These electrodes can be formed of the same or different materials. Collar 140 is typically formed of a dielectric material such as silicon dioxide ($SiO_2$), silicon nitride (SiN), silicon carbide (SiC), aluminum nitride (AlN), zinc oxide (ZnO), aluminum oxide ($Al_2O_3$), diamond, diamond like carbon (DLC), or lead zirconium titanate (PZT), for instance. Frame 145 is typically formed of one or more conductive or dielectric materials, such as W, Mo, Cu, $SiO_2$, SiN, AlN, ZnO, $Al_2O_3$, DLC, or SiC, for example. Piezoelectric layer 125 can be formed of a thin film of piezoelectric material, such as ZnO, AlN or PZT, for example. Other materials may be incorporated into these and other features of acoustic resonator 100B without departing from the scope of the present teachings.

A double-headed arrow 112 indicates a main membrane region, or active region, of acoustic resonator 100B, and dotted vertical lines indicate a boundary of the main membrane region. This boundary coincides with the edge of top electrode 135, except on connecting side 101, which extends beyond the boundary of the main membrane region. Double-headed arrows 114 and 116 indicate respective collar and frame regions of acoustic resonator 100B, and corresponding dotted vertical lines indicate boundaries of these regions. When viewed from a top angle, such as that of FIG. 1A, the above regions and their boundaries may have an apodized shape. As illustrated in FIG. 1B, collar 140 has an inner edge that is substantially aligned with the boundary of the main membrane region, and frame 145 has an outer edge that is substantially aligned with the same boundary.

In the example of FIG. 1B, the main membrane region does not include the full extent of overlap between bottom and top electrodes 115 and 135 and piezoelectric layer 125, because the illustrated right side of top electrode 135 is a connecting edge and it is not intended to modify the characteristic electrical impedance at an operating, frequency range of acoustic resonator 100B in any significant way. However, an overlap between bottom electrode 115, piezoelectric layer 125, top electrode 135 and substrate 105 in the top electrode connecting edge, usually referred to as "dead FBAR", may cause significant acoustic energy loss since piston mode is electrically excited all the way to the outer perimeter of air cavity 110 in that region, where it may couple to propagating modes supported by substrate 105 region. The presence of collar 140 in that region may minimize that unwanted energy loss by mass-loading the top-electrode connecting edge which in turn significantly lowers the amplitude of electrically excited piston mode at an outer edge of air cavity 110.

During typical operation of acoustic resonator 100B, as a part of a ladder filter, for instance, an input electrical signal may be applied to an input terminal of bottom electrode 115 and top electrode 135 may be connected to the output terminal. The input electrical signal typically comprises a time-varying voltage that causes vibration in the main membrane region. This vibration in turn produces an output electrical signal at an output terminal of top electrode 135. The input and output terminals may be connected to bottom and top electrodes 115 and 135 via connection edges that extend away from the main membrane region as shown in FIG. 1B. For example, from a top view, these connection edges may be seen to extend outside of an apodized pentagon shape such as that illustrated in FIG. 1A. The input and output terminals of acoustic resonator 100B may be connected to appropriate terminals of other acoustic resonators forming the ladder filter, for instance.

The electrically excited piston mode is terminated at the edge of top electrode 135. This structural discontinuity at the edge of top electrode 135 presents a significant discontinuity in cutoff frequencies between the main membrane and peripheral regions, and it causes excitation of lateral modes in both the main membrane and peripheral regions to facilitate continuity of appropriate particle velocity and stress components at the interface between these both regions. This can lead to undesirable scattering of acoustic energy from the piston mode and the resulting degradation of electrical response of acoustic resonator 100B. Collar 140, however, provides mass loading which lowers the cutoff frequency outside the main membrane region, producing a more laterally uniform cutoff frequency profile across acoustic resonator 100B. Similarly, frame 145 suppresses electrically excited piston mode in the frame region, and it reflects and otherwise resonantly (exponentially) suppresses propagating (evanescent and complex) eigenmodes lateral directions, with both effects simultaneously improving operation of acoustic resonator 100B. In other words, performance improvement of acoustic resonator 100B is facilitated by at least one of a cut-off frequency mismatch and an acoustic impedance mismatch between the frame region and other portions of the main membrane region which is produced by frame 145.

Figure 1C:
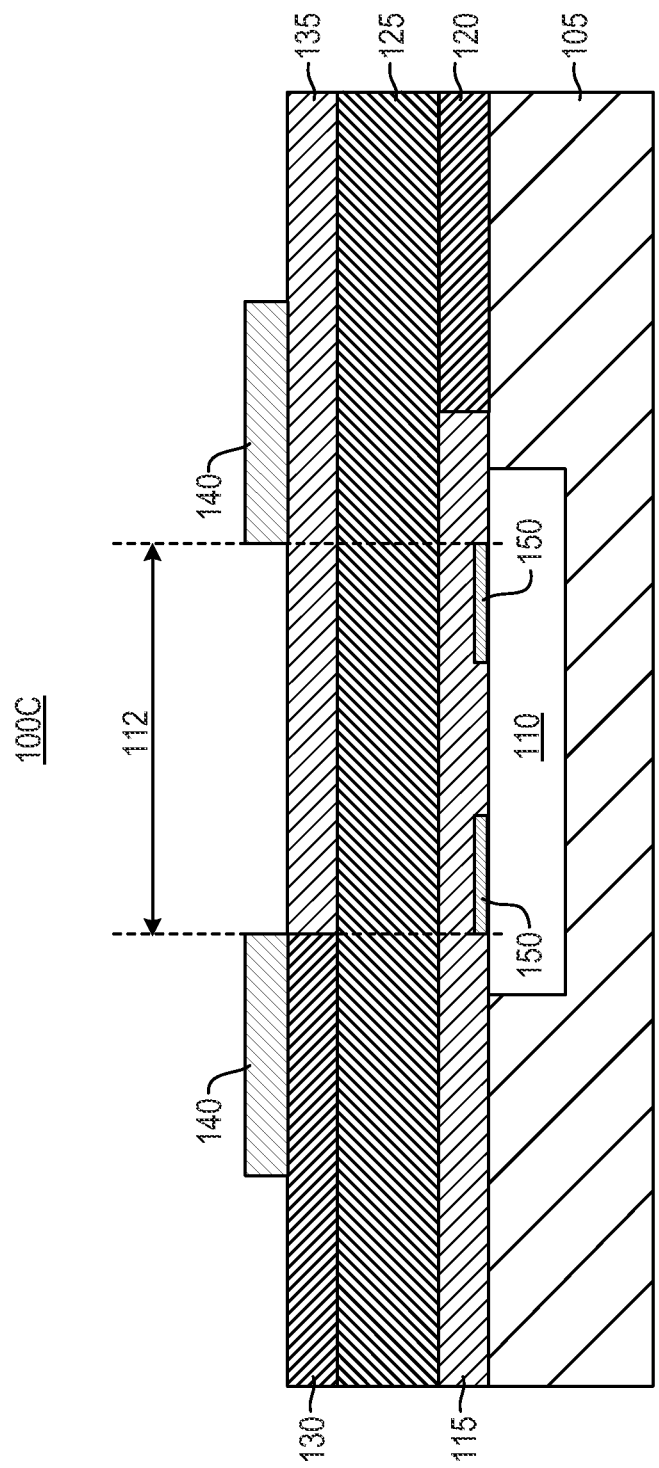
FIG. 1C is a cross-sectional view of an acoustic resonator according to another representative embodiment.
Figure 1D:
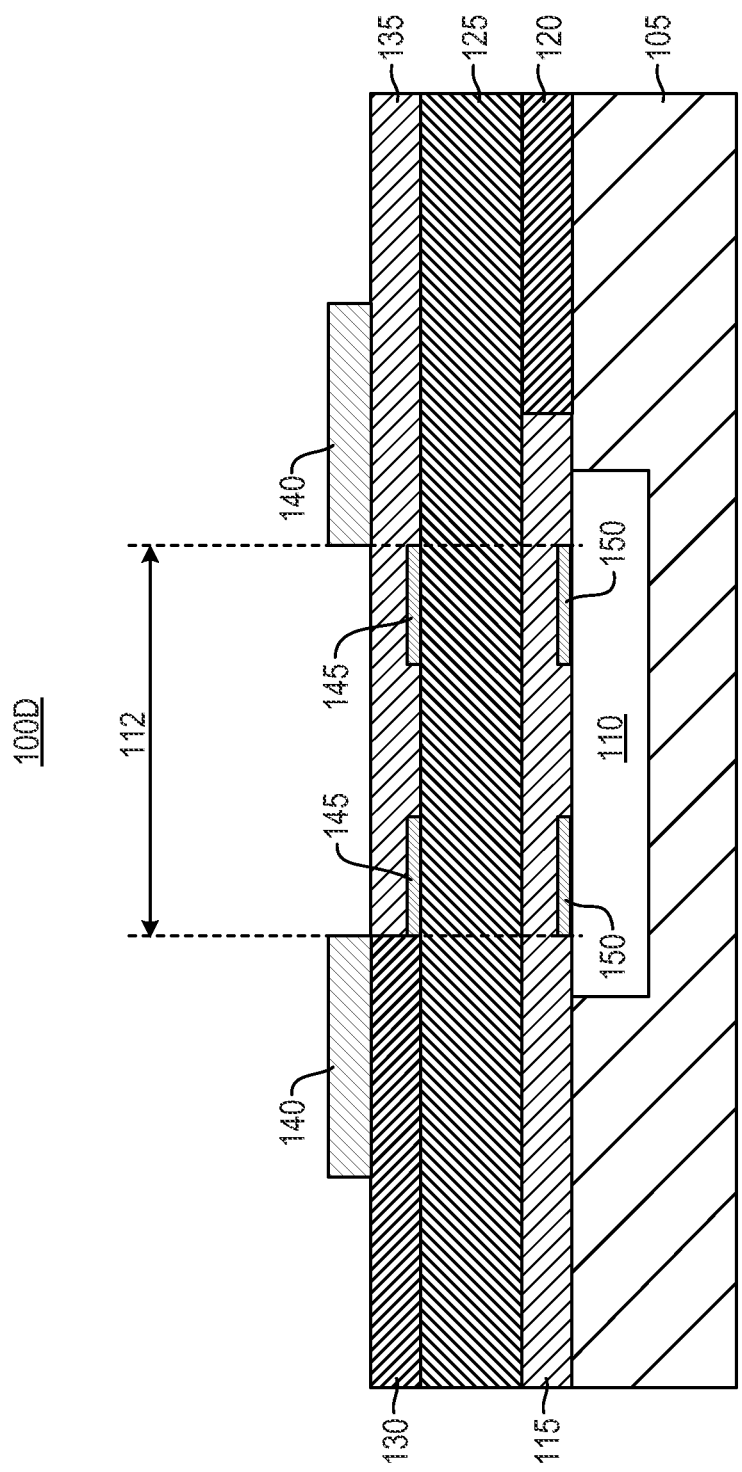
FIG. 1D is a cross-sectional view of an acoustic resonator according to another representative embodiment.
Figure 1E:
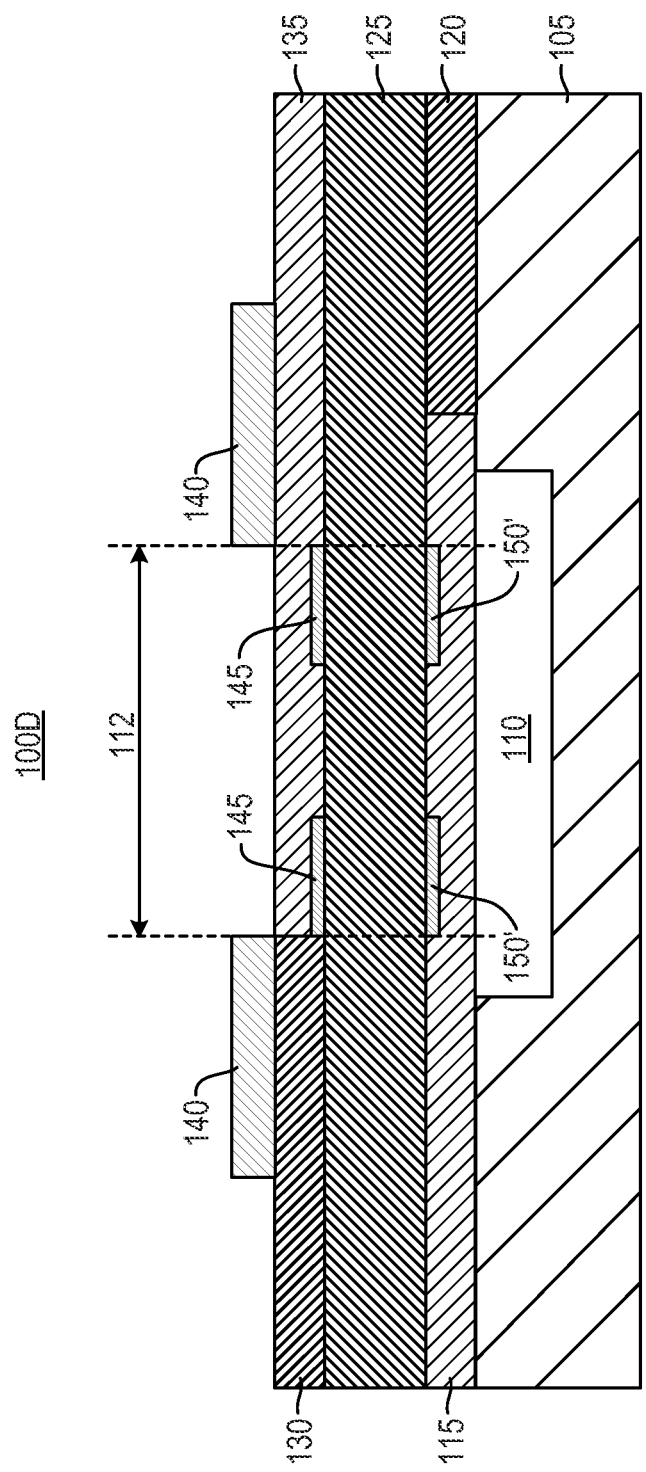
FIG. 1E is a cross-sectional view of an acoustic resonator according to another representative embodiment.
Figure 2A:
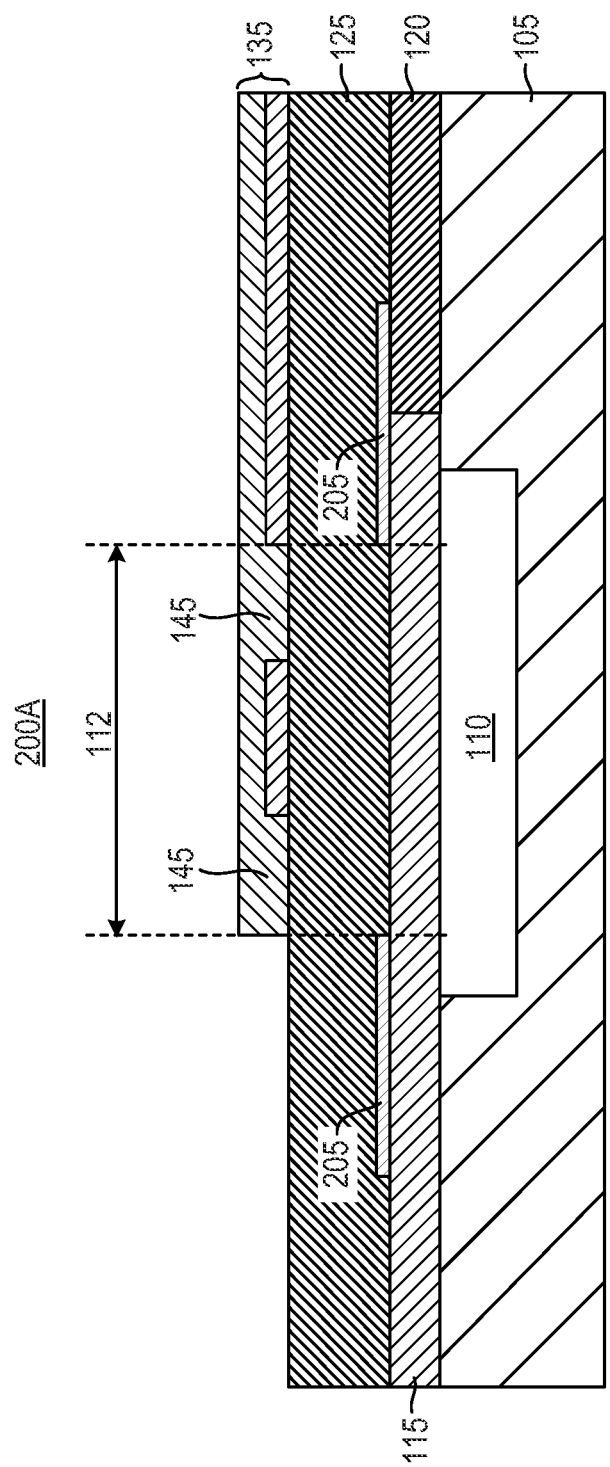
FIG. 2A is a cross-sectional view of an acoustic resonator according to another representative embodiment.
Figure 2B:
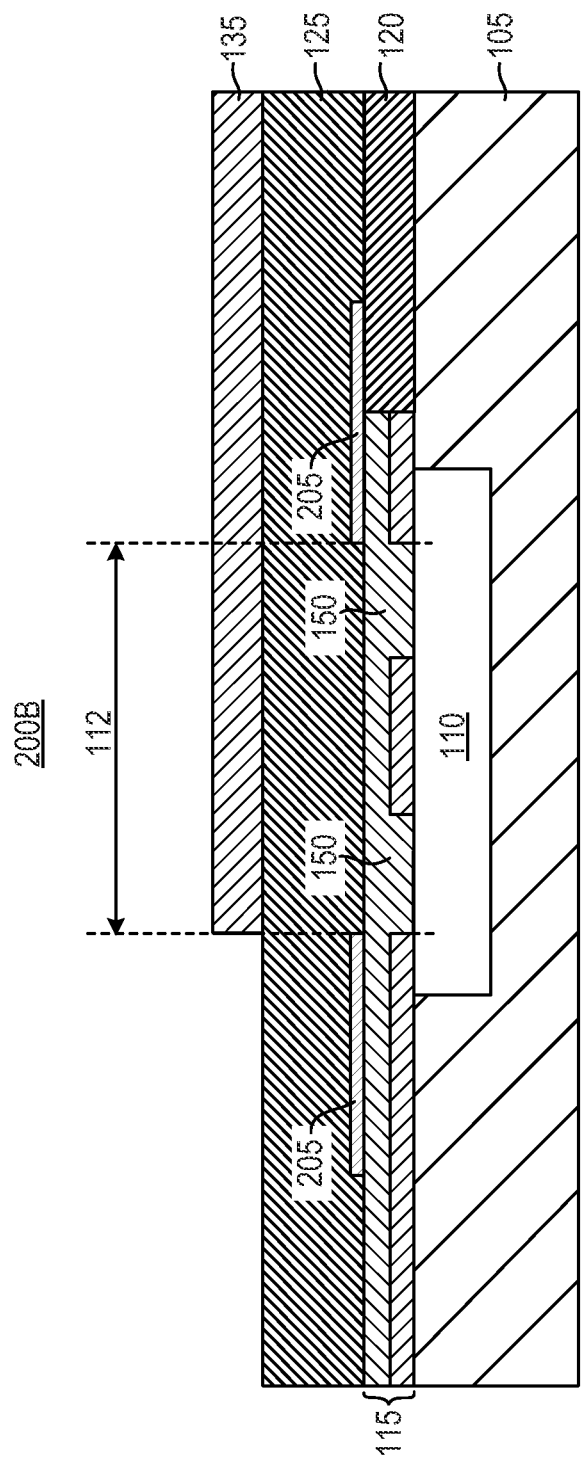
FIG. 2B is a cross-sectional view of an acoustic resonator according to another representative embodiment.
Figure 2C:
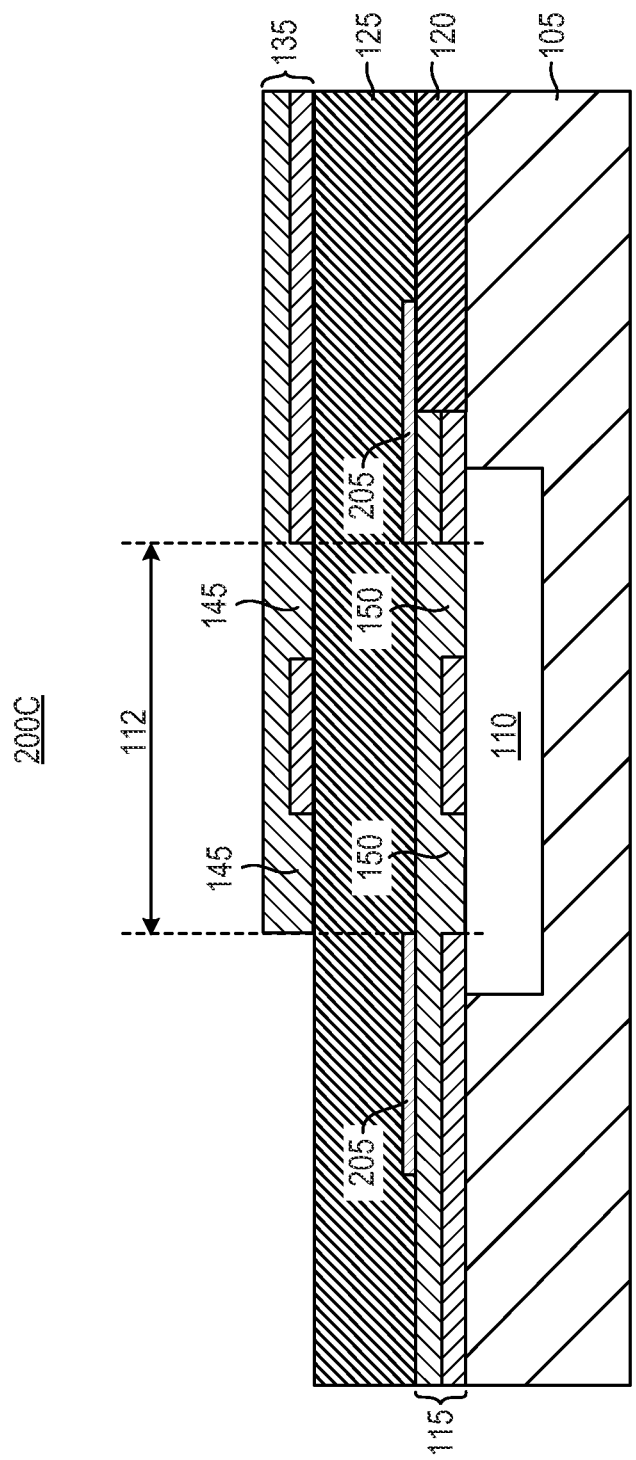
FIG. 2C is a cross-sectional view of an acoustic resonator according to another representative embodiment.
Figure 2D:
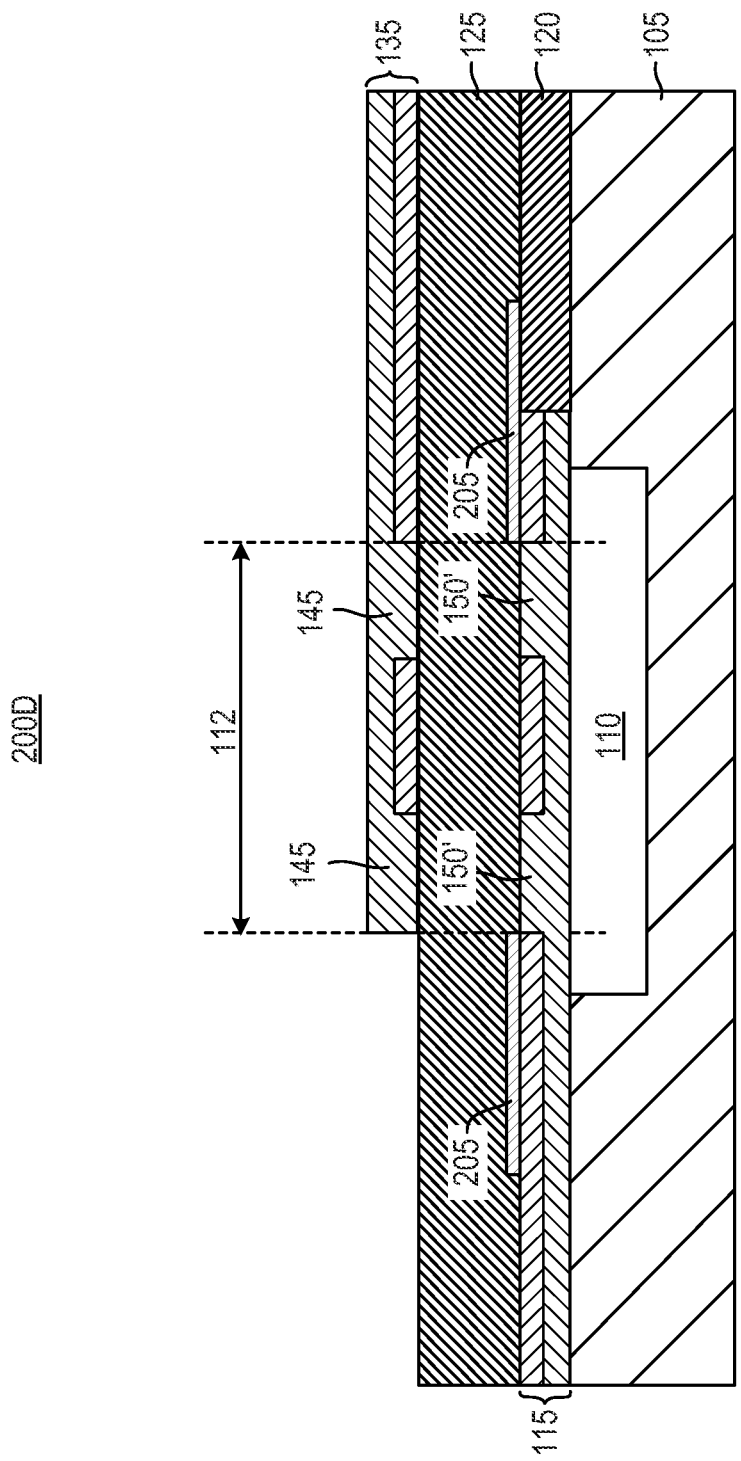
FIG. 2D is a cross-sectional view of an acoustic resonator according to another representative embodiment.
Figure 3B:
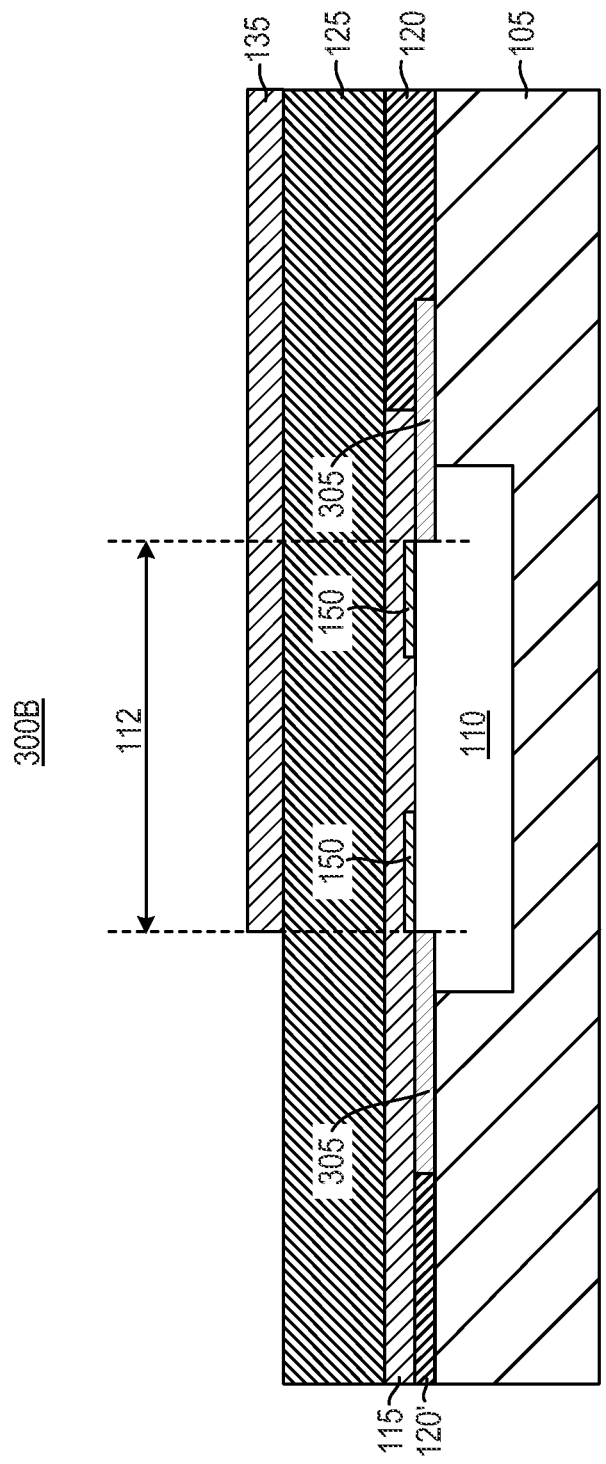
FIG. 3B is a cross-sectional view of an acoustic resonator according to another representative embodiment.
Figure 3C:
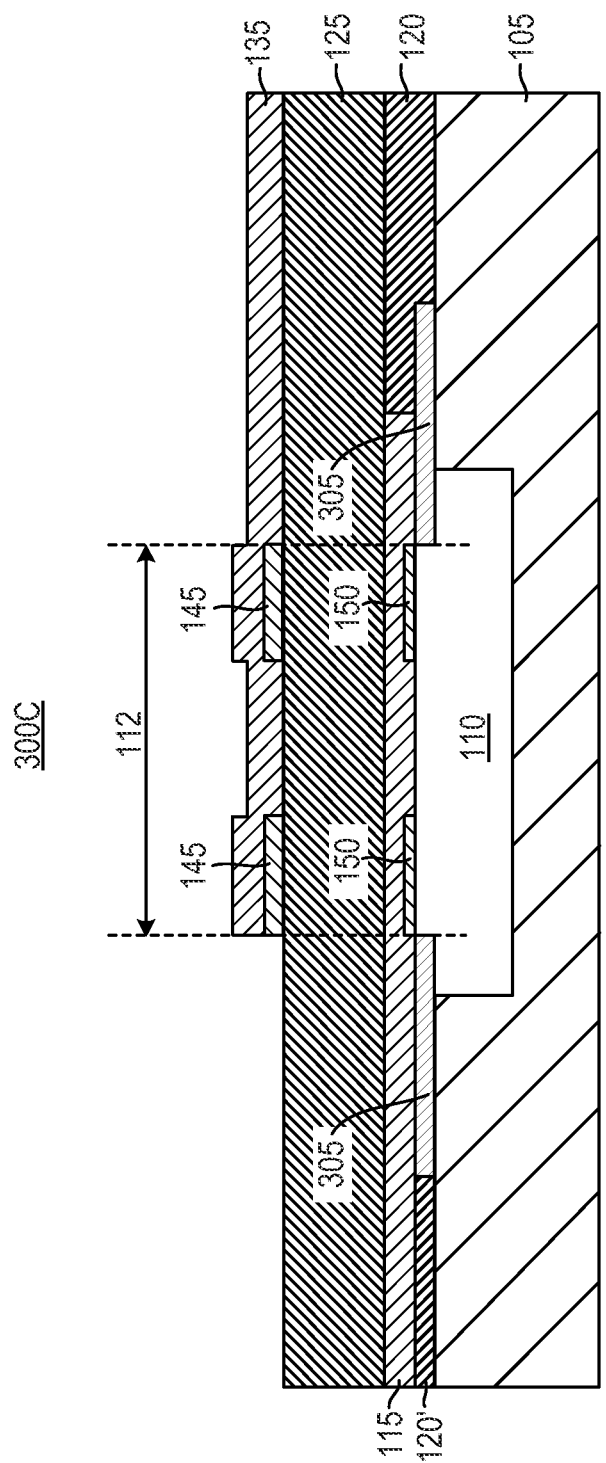
FIG. 3C is a cross-sectional view of an acoustic resonator according to another representative embodiment.
Figure 3D:
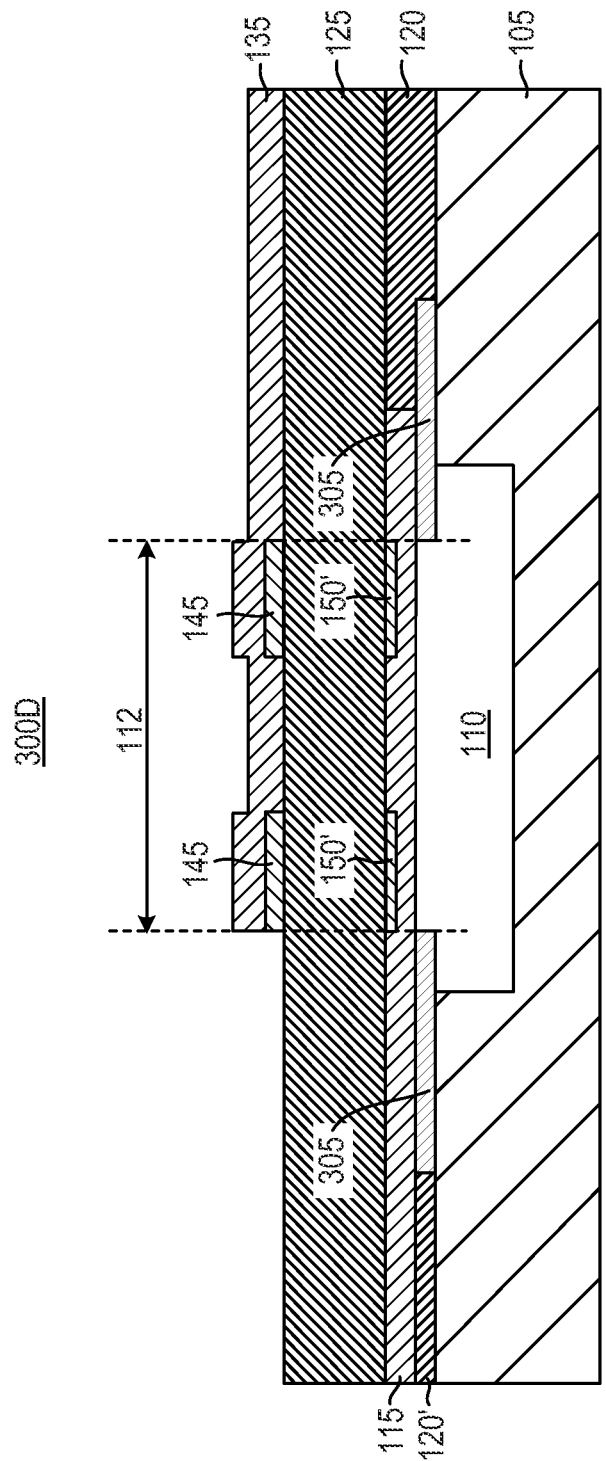
FIG. 3D is a cross-sectional view of an acoustic resonator according to another representative embodiment.

Referring to FIGS. 1C, 1D, and 1E, acoustic resonator 100C is substantially the same as acoustic resonator 100B, except that frame 145 is omitted and replaced by a frame 150 located at a bottom portion of bottom electrode 115. Acoustic resonator 100D is substantially the same as acoustic resonator 100B, except that frames 145 and 150 are both present. Acoustic resonator 100E, is substantially the same as acoustic resonator 100D, except that frame 150 is replaced by a frame 150', which is located at a top portion of bottom electrode 115 instead of a bottom portion. The frames in acoustic resonators 100C through 100E provide benefits similar to frame 145 of acoustic resonator 100B, although their performance and manufacturing processes will vary somewhat from acoustic resonator 100B due to the different locations of the frames. Some general tradeoffs of different frame configurations are described, for instance, in the above cited U.S. patent application Ser. No. 13/660,941.

FIGS. 2A through 2D are cross-sectional views of acoustic resonators 200A through 200D according to still other representative embodiments. These acoustic resonators are substantially the same as acoustic resonators 100B through 100E, respectively, except that collar 140 is omitted and a collar 205 is instead formed between bottom electrode 115 and piezoelectric layer 125. Collar 205 provides benefits similar to collar 140 of acoustic resonators 100B through 100E, although its performance and manufacture wilt vary somewhat due to the different location of collar 205. Note that for illustrative purposes, the composite frames formed in the bottom electrodes 115 of acoustic resonators 200A through 200D are constructed differently than the frames in the bottom electrodes of acoustic resonators 100B through 100E. The top electrode in FIGS. 2A, 2C and 2D comprises of two different metal materials. The bottom electrode in FIGS. 2B, 2C and 2D also comprises of two different metal materials. The frame is formed by embedding the first electrode material into the second electrode material in respective electrodes, as illustrated in FIGS. 2A through 2D. Some general tradeoffs of different frame configurations are described, for instance, in the above cited U.S. patent application Ser. No. 13/663,449.

FIGS. 3A through 3D are cross-sectional views of acoustic resonators 300A through 300D according to still other representative embodiments. These acoustic resonators are substantially the same as acoustic resonators 100B through 100E, respectively, except that collar 140 is omitted and a collar 305 is instead formed between bottom electrode 115 and substrate layer 105. In other words, collar 305 is formed below bottom electrode 115. Like collar 205, collar 305 provides benefits similar to collar 140 of acoustic resonators 100B through 100E, although its performance and manufacture will vary somewhat due to the different location of collar 305. Unlike acoustic resonators 100B through 200D where all frames are composite frames, the frames in top electrodes 135 of acoustic resonators 300A, 300C and 300D shown in FIGS. 3A, 3C and 3D, respectively, are the add-on frames. Such frames result in substantially non-planar top electrode 135 profiles in acoustic resonators 300A, 300C and 300D. Generally, because usually only a passivation layer would be formed on top electrode 135, such non-planar profile of the top electrode 135 would not have any significant impact on structural robustness of acoustic resonators 300A, 300C and 300D. On the other hand, composite frames are formed in bottom electrode 115 of acoustic resonators 300B, 300C and 300D. Such substantially planar frames are preferable in the bottom electrode 115 in order to form a high quality, void-free piezoelectric layer 125 and a top electrode layer 135 above the bottom electrode 115. Some additional general tradeoffs of different frame configurations are described, for instance, in the above cited U.S. patent application Ser. No. 13/663,449.

Figure 4:
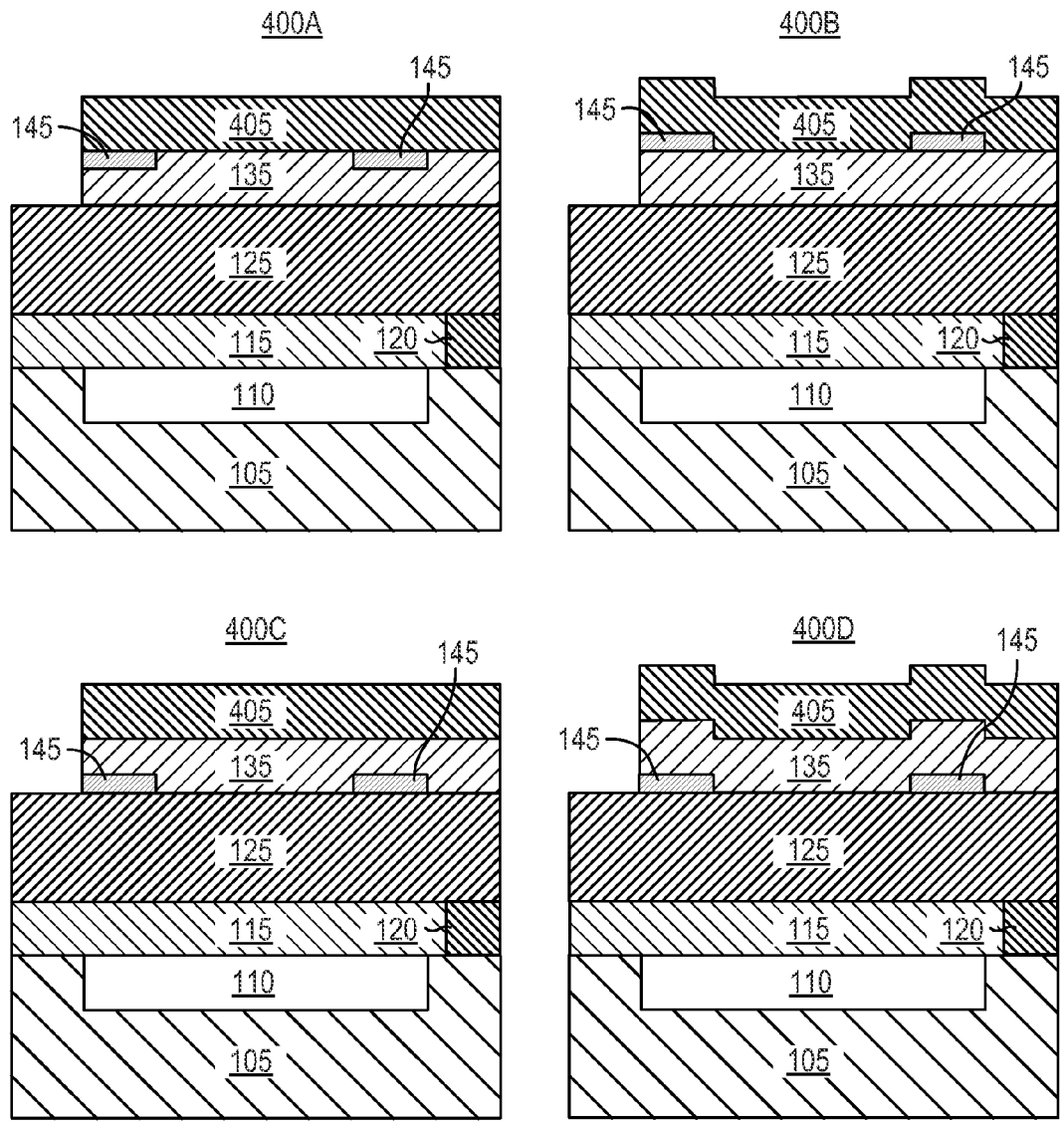
FIG. 4 is a diagram illustrating four different examples of frame configurations that may be used in the acoustic resonators of various representative embodiments.

FIG. 4 is a diagram illustrating four different examples of frame configurations that may be used in the acoustic resonators of various representative embodiments. These examples are shown without collars in order to illustrate the individual impact of the frames, but the described embodiments would typically use these frames in combination with collars such as those illustrated in FIGS. 1 through 3. These frame configurations will be discussed in conjunction with Table 1 below to show how both the flume geometry and materials can affect the operation of an acoustic resonator. More specifically, the following discussion will explain how the use of these different frame geometries and materials can raise or lower the cutoff frequency of the frame region relative to a portion of the main membrane region inside the frame region.

Referring to FIG. 4, four different frame configurations 400A through 400D comprise composite frames or add-on frames formed either at a top portion or a bottom portion of a top electrode. Configuration 400A comprises a composite frame formed on the top of top electrode 135, configuration 400B comprises an add-on frame formed on the top of top electrode 135, configuration 400C comprises a composite frame formed under the top electrode 135, and configuration 400D comprises an add-on frame formed under the top electrode 135. As described above in relation to other embodiments, the composite frames allow the top electrode to be formed with a planar upper surface, but the add-on frames do not. The add-on frames are generally easier to manufacture than the composite frames, but they typically produce outcroppings in overlying layers (e.g., the passivation layer 405 in configuration 400B and top electrode 135 and passivation 405 layers in configuration 400D), which may reduce mechanical robustness of the acoustic resonators, among other things.

In each of the illustrated configurations, a bottom electrode is formed of Mo with a thickness of approximately 3800 A, a piezoelectric layer is formed of AlN with a thickness of approximately 9300 A, a top electrode is formed of Mo with a thickness of approximately 3250 A, and a passivation layer is formed of AlN with a thickness of approximately 2000 A. Each of the frames is formed with a thickness of approximately 500 A.

Table 1 illustrates a general behavior of configurations 400A through 400D for frames formed with a non-limiting set of various different materials. In Table 1, the abbreviation LVF stands for a "Low Velocity Frame" and indicates that the cutoff frequency of the frame region ($F_{SF}$) is lower than the cutoff frequency of a portion of the main membrane region located inside the frame region $F_{SM}$ ($F_{SF} < F_{SM}$). Similarly, the abbreviation HVF stands for "High Velocity Frame" and indicates that the cutoff frequency in the frame region $F_{SF}$ is higher than the cutoff frequency in the main membrane region $F_{SM}$ ($F_{SF}>F_{SM}$). For convenient reference, the normalized acoustic impedances (Za) and normalized sound velocities (V) of these respective materials are shown in order to illustrate the relationship between these variables and the cutoff frequency shifts of the different configurations. Because the top electrode in the examples of configurations 400A through 400D is formed of Mo, the acoustic impedances and sound velocities have been normalized with respect to corresponding Mo values for acoustic impedance and sound velocity. In Table 1, CDO stands for carbon-doped silicon oxide, BSG for boron doped silicon oxide, HZa-SiC for high acoustic impedance sputtered SiC, for low acoustic impedance SIC grown by CVD, and Be for Beryllium. Examples of how to grow and use some of these materials, CDO in particular, are disclosed in U.S. Patent Application Publication No. 2011/0204996 by Steve Gilbert et al., the subject matter of which is hereby incorporated by reference. Examples of how to grow and use BSG are disclosed in the above cited U.S. Pat. No. 7,345,410 (Mar. 18, 2008) to Grannen et al.

TABLE 1

| Normalized Za | Normalized V | Material | 400A | 400B | 400C | 400D |
|---|---|---|---|---|---|---|
| 1.00 | 1.00 | Mo | N/A | LVF | N/A | LVF |
| 1.62 | 0.85 | W | LVF | LVF | LVF | LVF |
| 0.27 | 1.03 | Al | HVF | LVF | LVF | LVF |
| 0.37 | 2.08 | Be | HVF | LVF | HVF | LVF |
| 0.09 | 0.61 | CDO | LVF | LVF | LVF | LVF |
| 0.30 | 1.37 | BSG | HVF | LVF | LVF | LVF |
| 0.47 | 1.68 | HZa-SiC | HVF | LVF | HVF | LVF |
| 0.18 | 1.03 | LZa-SiC | HVF | LVF | LVF | LVF |

As illustrated in Table 1, configurations 400B and 400D, which have add-on frames, produce low-velocity frame behavior, regardless of the material used for the frame. This is because in add-on frame region the stack is thicker, leading to longer round-trip time between top and bottom of the stack, and effectively to lower cut-off frequency in that region. On the other hand, configurations 400A and 400C produce tow-velocity frame or high-velocity frame behavior depending on frame's location in the stack, acoustic impedance and sound velocity of material used to form a frame. In general, for configuration 400A, where the frame is located above the top electrode 135, a high velocity frame behavior is produced for all materials shown in Table 1 with the exception for W and CDO. Note that these two materials have lower sound velocity than Mo, so the effective sound velocity in the frame region is lower than in the main membrane which is a reason for producing the low velocity frame behavior. All other materials have higher sound velocity than Mo, therefore, upon substitution of Mo layer with equivalent thickness, they yield high velocity frame behavior. For configuration 400C, where the frame is located below top electrode 135, low velocity frame behavior is produced for all materials shown in Table 1 with the exception for HZa-SiC and Be. Note that only W and CDO have lower sound velocity than Mo, which would lead to the expected low velocity frame behavior as for configuration 400A. The reason for the low velocity frame behavior for frame materials other than W and CDO is that for a typical stack shown in configuration 400C, approximately 70 to 90 percent of energy is confined in piezoelectric layer 125, with the specific amount determined by thickness and acoustic impedance of bottom 115 and top 135 electrodes formed of Mo. A frame formed of low acoustic impedance material placed next to piezoelectric layer 125 allows for more energy confined otherwise in the piezoelectric layer 125 to penetrate through the to top the stack, thus increasing contributions of top Mo and a frame layer velocities to the weighted sum of velocities from all materials present in the stack. Because the sound velocity of Mo is approximately 40% lower than the sound velocity of AlN (in the specific stack example used to produce Table 1), the overall frequency in the acoustic stack shifts down, producing a low velocity frame. This is especially evident for materials for which the sound velocity of a frame material is comparable to or lower than the sound velocity of Mo (like for Al, CDO, BSG, LZa-SiC, for example). However, because both Be and HZa-SiC have sound velocities significantly larger than the sound velocity of Mo, their contributions cause the net increase of effective stack velocity in the frame region, causing high velocity frame behavior. As should be appreciated by one skilled in the art, the behavior presented in Table 1 depends strongly on material properties used in the simulations, which may vary depending of specific growth conditions, equipment and technique, and therefore the results in Table 1 are shown for illustrative purposes only. Also, different behavior may be obtained for different designs, thicknesses and set of materials used to form acoustic stacks of configurations 400A and 400C, as should be appreciated by one skilled in the art.

Figure 5A:
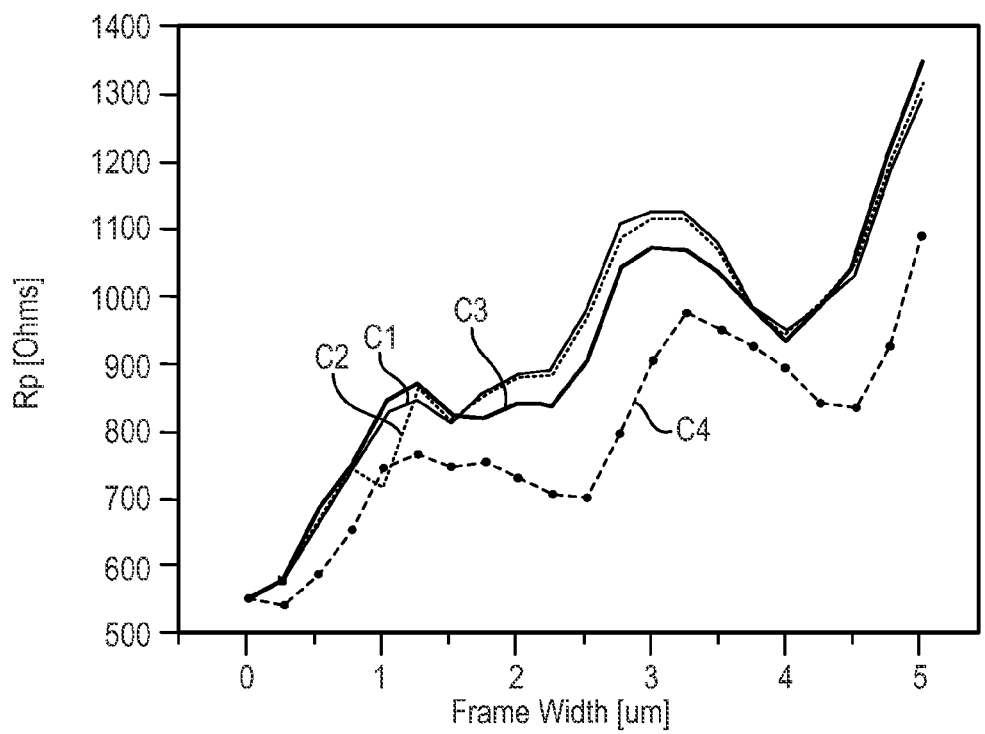
FIG. 5A is a graph illustrating the parallel resistance Rp of the acoustic resonator of FIG. 1B, but without a collar, as a function of the width of a composite frame.
Figure 5B:
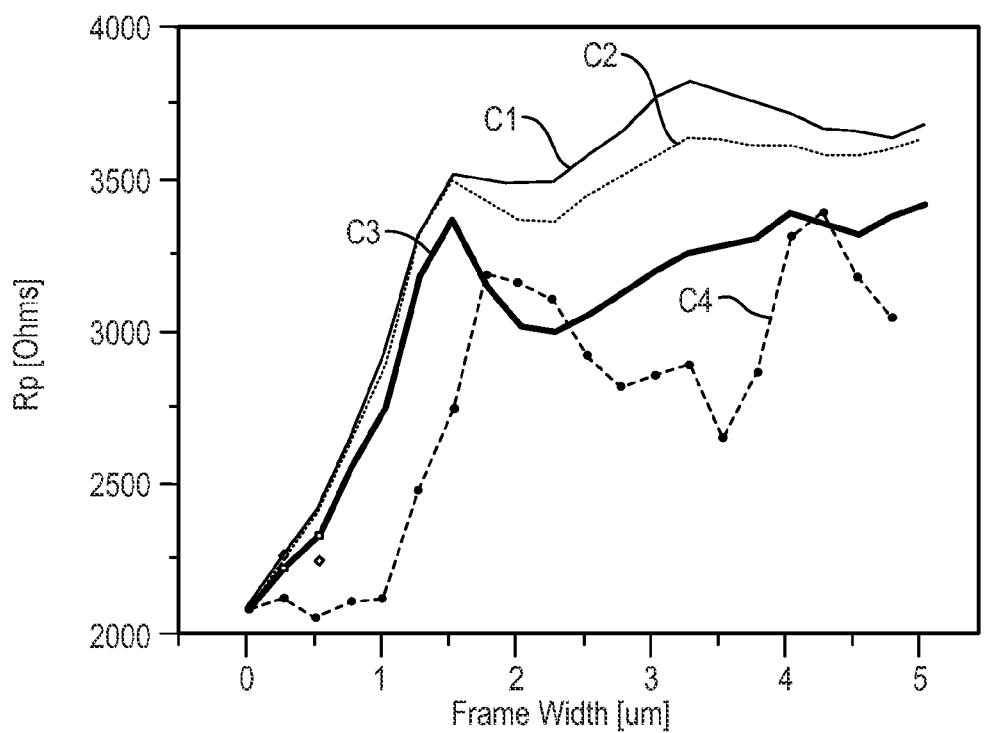
FIG. 5B is a graph illustrating the parallel resistance Rp of the acoustic resonator of FIG. 1B, but as a function of the width of a composite frame.

FIG. 5A is a graph illustrating the simulated parallel resistance Rp of acoustic resonator 100B, without collar 140 and the second planarization layer 130, as a function of the width of frame 145, and FIG. 5B is a graph illustrating the parallel resistance of the same acoustic resonator, with collar 140 and second planarization layer 130, as a function of the width of frame 145. In the examples of FIGS. 5A and 5B, bottom electrode 115 is formed of Mo with a thickness of approximately 3800 A, piezoelectric layer 125 is formed of AlN with a thickness of approximately 9300 A, top electrode 135 is formed of Mo with a thickness of approximately 3250 A, and a passivation layer is formed of AlN with a thickness of approximately 2000 A. Collar 140 is formed of sputtered SiC with a width of approximately 11.5 um and a thickness of approximately 4500 A.

Referring to FIGS. 5A and 5B, four curves C1 through C4 correspond to four different simulations. In these different simulations, frame 145 is formed of Al with respective thicknesses of 350 A, 500 A, 1000 A, and 2000 A. As illustrated by the curves in both FIGS. 5A and 5B, the addition of frame 145 (frame width >0) tends to improve the parallel resistance Rp of acoustic resonator 100B, both with and without collar 140. The magnitude of the improvement varies as a periodic function of the width of frame 145, and it tends to increase generally as the width of frame 145 increases. Additionally, for most widths of frame 145, the value of Rp tends to be higher for the thinner versions of frame 145, as illustrated by curves C1 and C2, for example.

The addition of collar 140, without any frame, increases Rp by a factor of approximately four, from approximately 500 ohms (FIG. 5A, width=0) to approximately 2000 ohms (FIG. 5B, frame width=0). Having both collar 140 and frame 145 has an additive effect on Rp, yielding a total increase of approximately 6 times, from approximately 550 ohms (FIG. 5A, frame width=0) to approximately 3600 ohms for the best simulated collar/frame design (FIG. 5B, curve C1, frame width=3.25 um). As explained with regard to FIG. 7B below, this additive improvement can be attributed generally to minimization of piston mode scattering loss at interfaces between the frame region and the inner portion of the main membrane region and between the frame region and the collar region, and also to improved suppression of propagating modes excited as a result of piston mode scattering.

Figure 6:
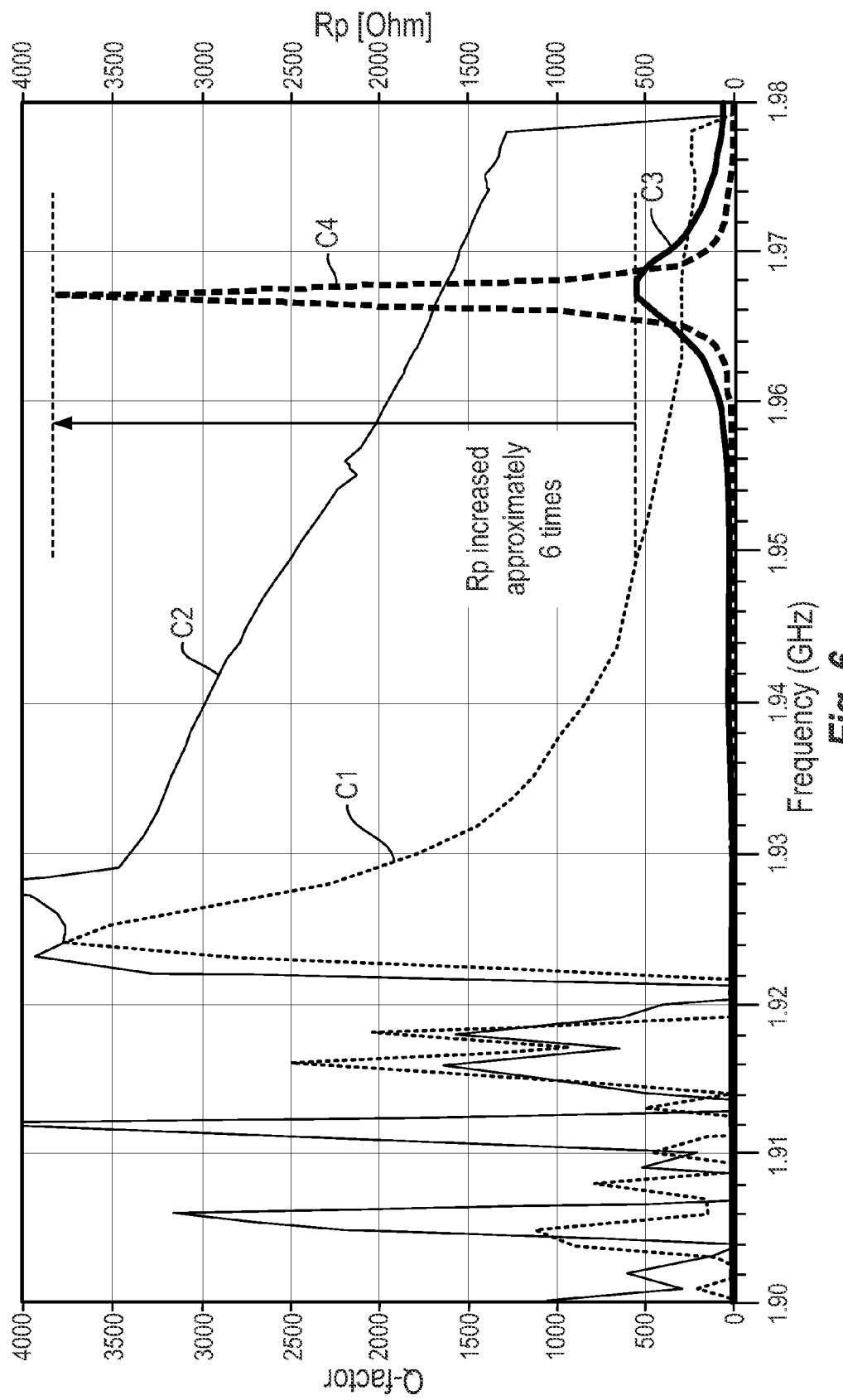
FIG. 6 is a graph illustrating the quality factor (Q-factor) and parallel resistance Rp of the acoustic resonator of FIG. 1B with and without a collar and frame.

FIG. 6 is a graph illustrating the simulated Q-factor and parallel resistance Rp of acoustic resonator 100B with and without collar 140 and frame 145. The version of acoustic resonator 100B without collar 140, second planarization layer 130 and frame 145 will be referred to as the "bare-resonator". The purpose of this graph is to illustrate changes in performance of the pass-band of acoustic resonator 100B that occur as a consequence of adding collar 140 and frame 145.

In the example of FIG. 6, the dimensions of acoustic resonator 100B have been tuned for high Rp. In particular, bottom electrode 115 is formed of Mo with a thickness of approximately 3800 A, piezoelectric layer 125 is formed of MN with a thickness of approximately 9300 A, top electrode 135 is formed of Mo with a thickness of approximately 3250 A, and a passivation layer is formed of AlN with a thickness of approximately 2000 A. Collar 140 is formed of sputtered SiC with a width of approximately 11.5 um and a thickness of approximately 4500 A, and frame 145 is formed of Al with a width of approximately 3.25 um and a thickness of approximately 350 A. Notably, the design of acoustic resonator 100B is the same as corresponding to highest simulated Rp value shown in FIG. 5B for device C1.

Referring to FIG. 6, Q-factor is represented by a y-axis on the left side, and Rp is represented by a y-axis on the right side. The values of the Q-factor and Rp are shown as a function of input signal frequency.

A first curve C1 illustrates the Q-factor, of the bare-resonator, and a second curve C2 illustrates the Q-factor of acoustic resonator 100B. A third curve C3 illustrates the Rp value of the bare-resonator, and a fourth curve C4 illustrates the Rp value of acoustic resonator 100B. More specifically, curves C3 and C4 illustrate magnitudes of complex-valued electrical impedance of acoustic resonator 100B. At parallel resonance frequency Fp electrical impedance becomes approximately real-valued and the peak value of electrical impedance magnitude indicates parallel resistance Rp.

A peak value of the Q-factor occurs for each of the devices at about 1.925 GHz. This frequency corresponds to the series resonance frequency Fs of the respective devices. Similarly, a peak value of Rp occurs for each of the two devices at about 1.968 GHz. This frequency corresponds to the parallel resonance frequency Fp of the respective devices. The bandwidth of these devices corresponds to the range of frequencies between their respective values of Fs and Fp. Accordingly, in this example, the two devices have similar bandwidths.

At frequencies above Fs, acoustic resonator 100B has significantly higher Q-factor than the bare-resonator. In addition, as illustrated by the respective peaks of third and fourth curves C3 and C4, acoustic resonator 100B has a significantly higher Rp value than the bare-resonator. In particular, acoustic resonator 100B has an Rp value of about 3800 ohms while the bare-resonator has an Rp value of about 550 Ohms. As should be appreciated by one of ordinary skill in the art, the Rp of acoustic resonator 100B is increased by approximately six (6) times without any significant degradation of the bandwidth when compared to the bare-resonator.

Figure 7A:
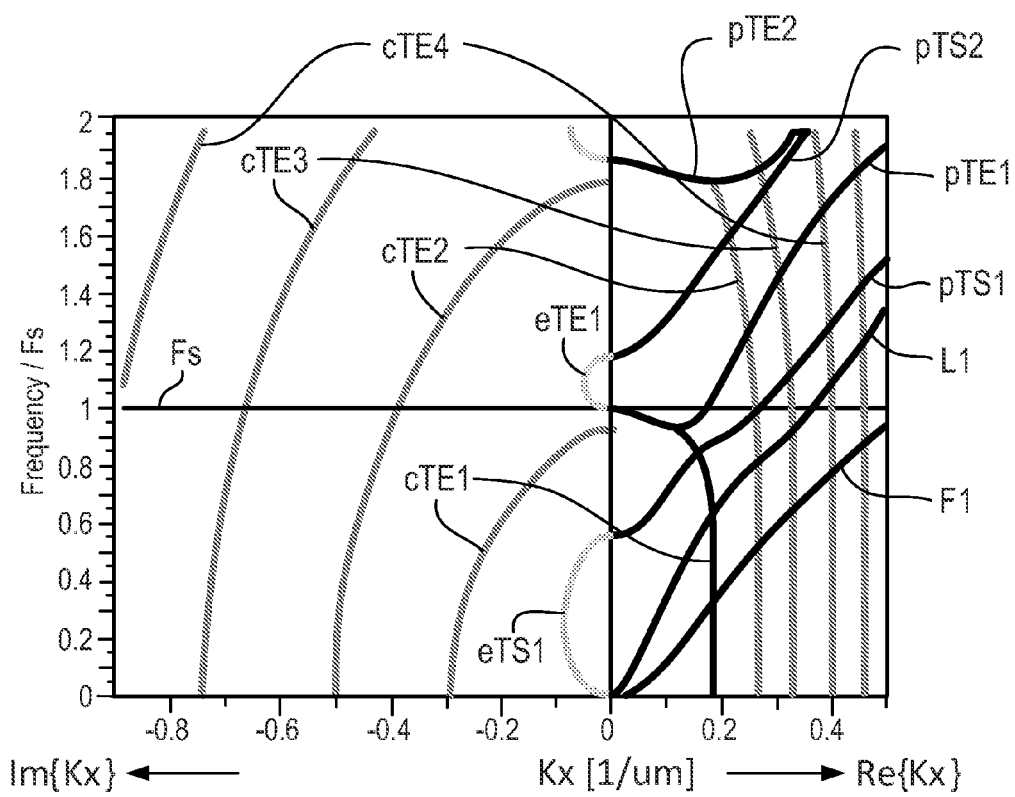
FIG. 7A is a graph illustrating an acoustic dispersion diagram for a collar region.

Certain aspects of designing acoustic resonator 100B for improved performance can be appreciated by investigating the modal structure in each lateral region of acoustic resonator 100B. FIG. 7A illustrates an acoustic dispersion diagram for the acoustic resonator 100B in the collar 140 region. In any other lateral region of acoustic resonator 100B the acoustic dispersion diagram would look qualitatively similar to one shown in FIG. 7A, except that dispersion curves would be extended (compressed) along the horizontal and vertical axes for regions having the cutoff frequency higher (lower) than the main membrane region.

The horizontal axis in FIG. 7A corresponds to the lateral wave-number Kx, with positive numbers indicating real Kx values and negative numbers indicating imaginary Kx values. Each point in FIG. 7A corresponds to an eigenmode of specific acoustic polarization and direction of propagation which is supported by a specific stack, as described below. A real Kx value indicates that a given mode is a propagating one (illustratively, it may propagate in a periodic fashion from a point of excitation) while an imaginary Kx value indicates that a given mode is an evanescent one (illustratively, it may decay exponentially from a point of excitation). The complex modes have both nonzero real and imaginary Kx values, and they propagate in a periodic fashion from the point of excitation while their amplitude decays exponentially. The vertical axis in FIG. 7A corresponds to frequency normalized to a cutoff frequency (for the first order thickness extensional mode TE1) of a main membrane region of acoustic resonator 100B. The acoustic resonator's operational region extends within approximately 5 percent below and above the horizontal line labeled as and indicating the series resonance frequency (or cut-off frequency for TE1 mode) of acoustic resonator 100B.

In FIG. 7A, curve F1 illustrates a flexural mode, curve L1 a dilatational mode, curve pTS1 a first order propagating thickness shear mode, curve pTE1 a first order propagating thickness extensional mode, curve pTS2 a second order propagating thickness shear mode, curve pTE2 a second order propagating thickness extensional mode, curve eTS1 a first order evanescent thickness shear mode, curve eTE1 a first order evanescent thickness extensional mode, and curves cTE1, cTE2, cTE3 and cTE4 first, second, third and fourth order complex thickness extensional modes, respectively. In general, there is an infinite number of complex thickness extensional modes and only four lowest order modes are identified in FIG. 7A.

The significance of the modes shown in FIG. 7A is that they are excited both at the structural discontinuities (like frame/membrane interface, top and bottom electrode edges) and at the electric field discontinuities (like top electrode edge) upon excitation of acoustic resonator 100B with the piston mode in region where bottom electrode 115, piezoelectric layer 125 and top electrode 135 overlap. These modes are excited in each lateral region of acoustic resonator 100B and their amplitudes are determined from the continuity of appropriate particle velocity and stress component at each lateral interface in acoustic resonator 100B. However, depending on the lateral region, these modes lead to different loss mechanisms. In the main membrane region these modes create laterally non-uniform vertical displacement profile, which, via the direct piezoelectric effect, creates laterally non-uniform voltage profile. Because high conductivity electrodes are placed below and above the piezoelectric layer, the laterally non-uniform voltage profile leads to lateral current flows and the resulting loss of acoustic energy to Joule heating. Notably, this loss mechanism is present for all modes excited in the membrane (that is eTE1, pTE1, pTS1, L1, F1, and all complex modes), provided that these modes are allowed to couple to electric field by nonzero thickness-extensional polarization component.

In regions outside of the top electrode, the evanescent and complex modes supported by the stack may not lead to any loss as tong as the distance between the top electrode edge and the edge of the air-cavity 110 is large enough to provide for sufficient exponential decay of amplitudes of these modes. On the other hand, propagating modes (like L1, F1 and TS1, if supported at a given frequency) may propagate freely to the edge of the air-cavity 110 and may lead to the loss by acoustic radiation to the substrate 105.

Figure 7B:
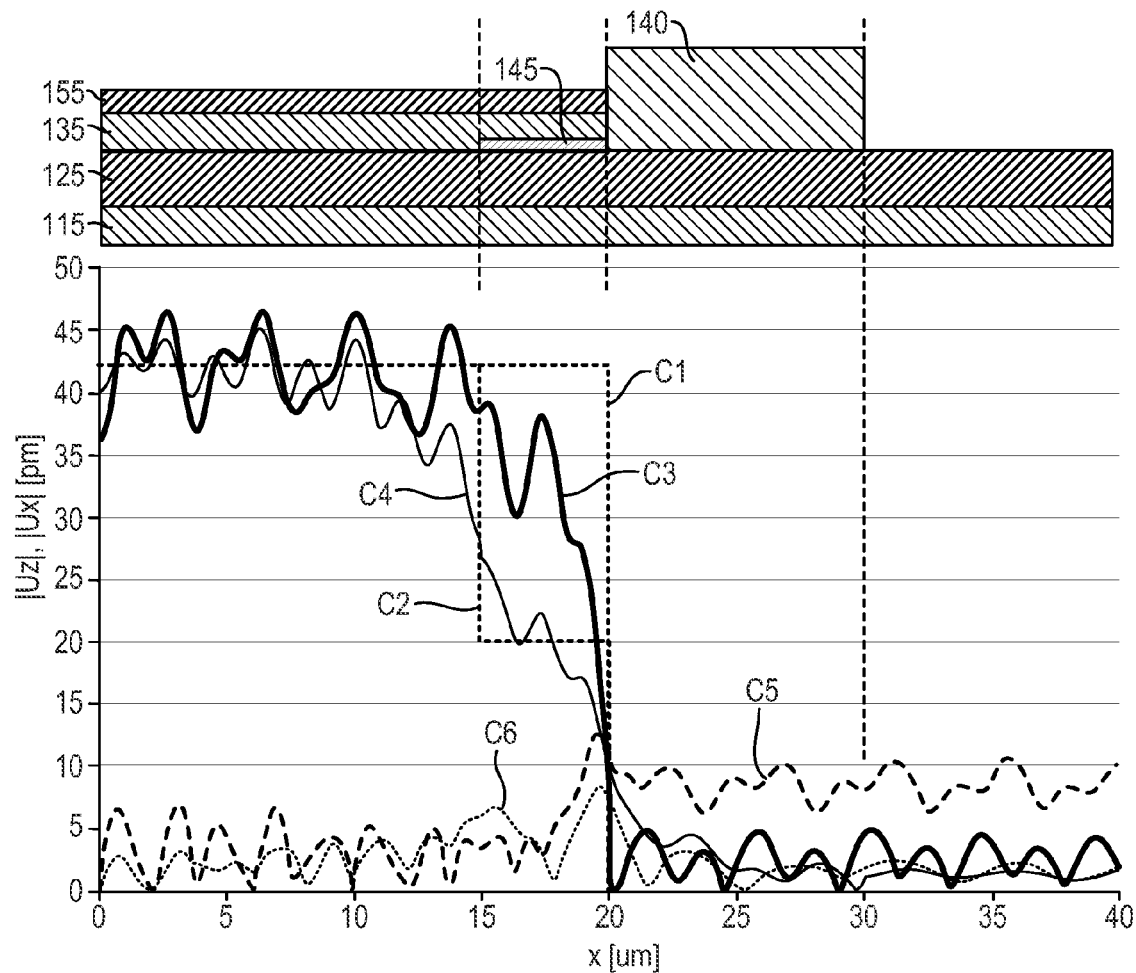
FIG. 7B is a graph illustrating a lateral profile of particle displacements of the acoustic resonator of FIG. 1B at a frequency above a series resonance frequency Fs.

From the above description it is apparent that in order to increase the performance of acoustic resonator 100B, all spurious modes in the main membrane region and propagating modes outside of the main membrane region should be suppressed. As described in relation to FIGS. 1B-3D, frames and collars may be used to suppress spurious modes and therefore increase the quality factor Q. The mechanism of such performance increase is shown illustratively in FIG. 7B. An upper part of FIG. 7B shows acoustic resonator 100B comprising bottom electrode 115, piezoelectric layer 125, top electrode 135, passivation layer 155, low velocity composite Al/Mo frame 145 and top collar 140, but without the substrate 105, with the purpose of providing information regarding horizontal location in the acoustic resonator 100B for a lower part of FIG. 7B. The lower part of FIG. 7B illustrates vertical and horizontal components of particle displacements calculated at a frequency above the series resonance frequency Fs along the bottom surface of the bottom electrode 115 shown in the upper part of FIG. 7B. Horizontal axis represents lateral location within the device measured in micro-meters (um), while vertical axis represents particle displacement measured in pica-meters (pm).

More particularly, curve C1 illustrates the magnitude of vertical (or longitudinal) Uz displacement of the piston mode in acoustic resonator 100B, but without collar 140 and composite frame 145 present. Curve C2 illustrates magnitude of vertical (or longitudinal) Uz displacement of the piston mode in acoustic resonator 100B for the structure with both collar 140 and composite frame 145 present. Curve C3 illustrates the magnitude of total (piston mode and all spurious modes) vertical (or longitudinal) Uz displacement in acoustic resonator 100B, but without collar 140 and composite frame 145 present. Curve C4 illustrates the magnitude of total (piston mode and all spurious modes) vertical (or longitudinal) Uz displacement in acoustic resonator 100B for the structure with both collar 140 and composite frame 145 present. Curve C5 illustrates the magnitude of total (all spurious modes, no piston mode component) horizontal (or shear) Ux displacement in acoustic resonator 100B, but without collar 140 and composite frame 145 present. Curve C6 illustrates the magnitude of total (all spurious modes, no piston mode component) horizontal (or shear) Ux displacement in acoustic resonator 100B for the structure with both collar 140 and composite frame 145 present. Curves C1 through C6 are calculated within so-called Acoustic Scattering Approximation (ASA). Within ASA, the source term for scattering problem is determined by curves C1 and C2 (essentially calculated from the Mason model at Kx=0), depending on geometry considered, and the total fields (curves C3 and C5, and C2 and C6, depending of geometry considered) are calculated from appropriate particle velocity and stress components continuity conditions at each lateral interface using modal expansion in terms of eigen-modes shown in FIG. 7A. Curves C1, C3 and C5 correspond to the bare-resonator, for which illustrative performance has been shown with curves C1 and C3 in FIG. 6. Curves C2, C4 and C6 correspond to a "best-resonator" (where "best" indicates the best observed performance in the described context), for which illustrative performance has been shown with curves C2 and C4 in FIG. 6. However, the notable difference between the best-resonator shown in FIG. 6 and the structure with composited frame and collar shown in FIG. 7B is that the lateral dimensions of a main membrane, composite frame 145 and collar 140 for structure shown in FIG. 7B are selected arbitrarily and for illustrative purposes only. In particular, the composite frame 145 is formed of 350 A thick Al and has a width of approximately 5 um, and the collar 140 is formed of SiC and has a width of approximately 10 um. The inner edge of a composite frame 145, the top electrode 135 edge and the outer collar 140 edge are indicated with vertical lines in the upper part of FIG. 7B.

Referring to FIG. 7B, for the bare-resonator the uniform piston mode extends all the way to the edge of the top electrode 135 located at horizontal coordinate equal to 20 um, as illustrated by the curve C1. Since the region outside of the top electrode is not electrically driven and supports distinctly different set of modes (L1, F1, pTS1 or eTS1, and infinitely many complex cTE modes, because the driving frequency is relatively close to Fs in the main membrane region, as compared to cut-off frequency in the region outside of the top electrode), the top electrode edge enforces an abrupt drop of the total particle displacement field, as illustrated by curve C3. More specifically, the amplitude of the vertical motion Uz decreases from approximately 42 pm at about 6 um distance from the top electrode edge to approximately 0 pm at the top electrode edge (located at the distance of 20 um from the device center at 0 um). This drop is accomplished by excitation of strong evanescent mode in the membrane region with additional excitation of propagating and complex modes both under the top electrode and outside regions, as indicated by curves C3 and C5. As described below with reference to FIG. 7C, the significant drop of Uz displacement under the top electrode within 7 um range may create a lateral voltage gradient, which may lead to lateral current flows in bottom and top electrodes 115 and 135, respectively, and may result in loss of energy due to Joule heating. Spurious propagating modes that cannot couple to the electric field may eventually be attenuated by viscous loss of the materials forming acoustic resonator 100B. At the same time, shear modes with total amplitude of approximately 8 pm are excited in the region outside of the top electrode, as illustrated by curve C5, leading to energy loss due to acoustic radiation. All these energy loss mechanisms contribute to lower quality factor Q of the bare-resonator, whose performance has been illustrated with curves C1 and C3 in FIG. 6.

Referring again to FIG. 7B, for the best-resonator comprising both a composite frame 145 and a collar 140, the uniform piston mode extends to the inside edge of the composite frame 145, where its amplitude is lowered by approximately 50 percent (for this specific frame design and driving frequency), as illustrated by the curve C2. Since the region outside of the top electrode comprises collar 140, it supports evanescent mode eTE1 which may efficiently mechanically couple with piston and eTE1 modes of the composite frame 145 (as both the collar 140 and the main membrane have substantially similar cutoff frequencies). In general, the thinner composite frame 145 is, the more efficient coupling between eTE1 modes becomes, as the cutoff frequencies in the main membrane, the composite frame 145 and the collar 140 become closer. This may partially explain why thin Al/Mo composite frames, of 350 A, 500 A and 1 kA, illustrated by curves C1, C2 and C3 in FIG. 5B, respectively, provided better performance than a 2 kA thick composite frame illustrated by curve C4 in FIG. 5B. The presence of evanescent modes in the main membrane, the composite frame 145 and the collar 140 allows for gradual decay of the total vertical displacement field as illustrated by curve C4. More specifically, the amplitude of the total vertical motion Uz decreases from approximately 42 pm at about 10 um distance from the top electrode edge to approximately 27 pm at the inner edge of the frame 145, and to approximately 10 pm at the top electrode edge and the inner edge of the collar 140. This drop is accomplished by excitation of relatively weak evanescent mode in the membrane region with additional weaker (as compared to the bare-resonator) excitation of propagating and complex modes both under the top electrode, frame, collar and outside regions, as indicated by curves C3 and C5. As described below with reference to FIG. 7C, the relatively small drop of Uz displacement under the top electrode within approximately 10 um range may create relatively smaller lateral voltage gradient (as compared to bare-resonator), which may lead to relatively smaller lateral current flows in bottom and top electrodes 115 and 135, respectively, and relatively smaller loss of energy due to Joule heating (as compared to the bare-resonator). At the same time, shear modes with total amplitude of approximately 3 pm are excited in the region outside of the top electrode (including collar), as illustrated by curve C6, leading to approximately 7 times smaller energy loss due to acoustic radiation as compared to a bare-resonator (as the amplitude of the Poynting vector describing acoustic radiation is proportional to squared amplitude of mechanical displacement).

Referring again to FIG. 7B, in addition to the above mentioned improvements to the device performance provided by frame 145 and collar 140, widths of these both structures may be adjusted to further minimize excitation of propagating modes shown as local peaks and valleys in curves C4 and C6. However, generally modes pTS1 and F1 are predominantly confined to one side of the stack (for example, around bottom electrode 115) while modes pTE1 and L1 are predominantly confined to the opposite side of the stack (for example, around top electrode 135). Thus placing composite or add-on (or both types, depending on process requirements) frames at different parts of the stack may have various impact on suppressing the propagating modes. Thus even though the example in FIG. 7B shows single composite frame and a single collar, more substantial performance improvement may be obtained by using frames and collars placed at multiple locations in the stack, as illustrated in the examples shown in FIGS. 1B through 3D. Moreover, even though the example in FIG. 7B shows single composite frame, similar improvements in acoustic resonator 100B quality factor may be obtained with add-on frames as well.

Figure 7C:
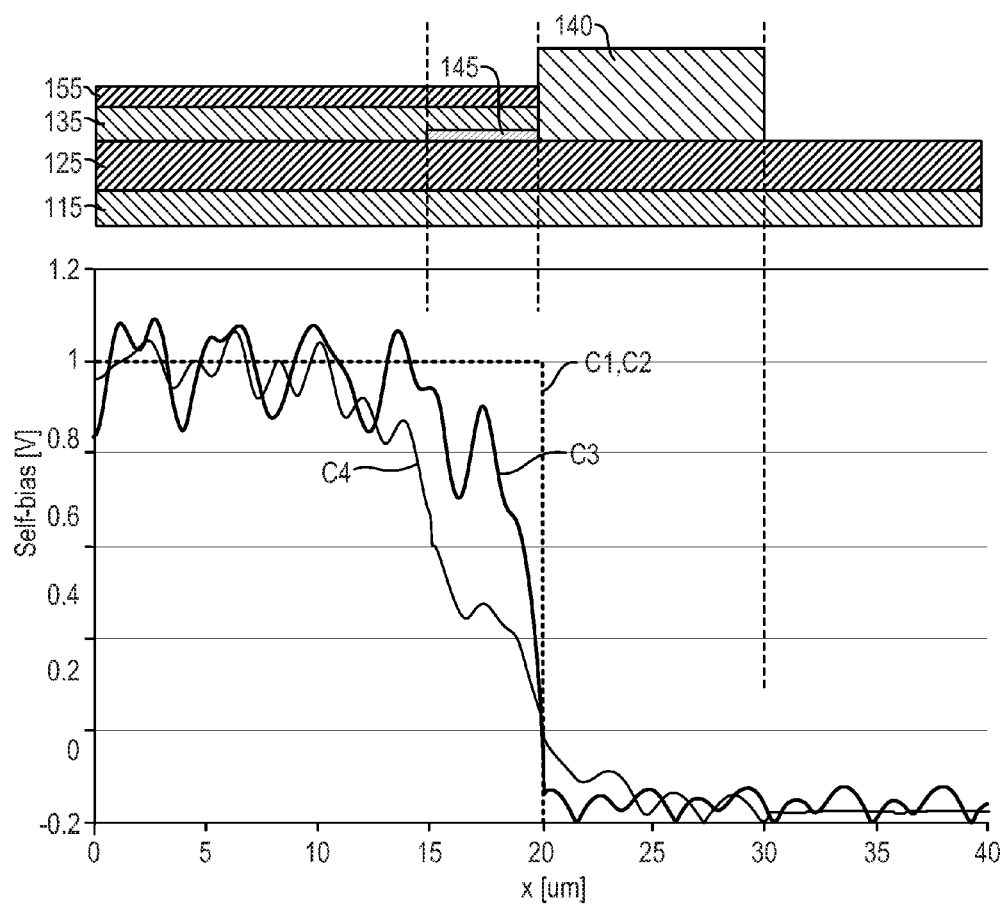
FIG. 7C is a graph illustrating self-bias produced by the particle displacement profile shown in FIG. 7B.

Energy loss due to Joule heating resulting from lateral current flows can be understood by analyzing lateral profile of electrical potential (self-bias) produced by lateral eigenmodes excited in acoustic resonator 100B. FIG. 7C illustrates self-bias produced by particle displacement distributions shown in FIG. 7B in various lateral regions of the device calculated for the top electrode 135 with grounded bottom electrode 115. In the model, no lateral current flows are allowed in either electrode. In particular, curves C1 and C2 illustrate lateral profile of voltage presented to piezoelectric layer 125 by the top electrode 135 for the bare-resonator and best-resonator, respectively, as described in relation to FIG. 7B. Curve C3 illustrates magnitude of self-bias produced by particle displacement profiles given by curves C3 and C5 in FIG. 7B for the bare-resonator. Curve C4 illustrates magnitude of self-bias produced by particle displacement profiles given by curves C4 and C6 in FIG. 7B for the best-resonator. Note that curves C1 and C2 are abruptly terminated at the top electrode 135 edge located at 20 um. However, curves C3 and C4 continue beyond the top electrode 135 edge as they represent electrical potential on the top of piezoelectric layer 125 created by mechanical motion of the stack. For the bare-resonator the voltage produced by the lateral particle distribution profile (curves C3 and C5 in FIG. 7B) decays from approximately 1V to approximately 0.1V over a distance of approximately 5 um towards the edge of the top electrode 135 as illustrated by curve C3. For the best-resonator the voltage produced by the lateral particle distribution profile (curves C4 and C6 in FIG. 7B) decays from approximately 1V to approximately 0.2V over a distance of approximately 10 um towards the edge of the top electrode 135 as illustrated by curve C4. Because the Joule heating under ideal voltage source conditions is proportional to a squared voltage difference between two points and inversely proportional to resistance between these two points, the energy loss due to the Joule heating in the top 135 electrode may be approximately 2 to 3 times smaller for the best-resonator as compared to the bare-resonator. The reduction of Joule heating in best-resonator comprising composite frame 145 and collar 140 described above is mostly related to reduction of self-bias decay towards the top electrode 135 edge with evanescent eTE1 modes supported by various parts of the structure, such as the main membrane, composite frame 145, and collar 140. However, additional benefits may be obtained by suppressing propagating modes in the main membrane region. In particular, smaller amplitude for self-bias ripples (resulting from propagating modes) in the central part of the device for best-resonator (curve C4) as compared to bare-resonator (curve C3) may lead to additional reduction of energy loss due to Joule heating.

In the above-described embodiments, collars and frames can generally be firmed using conventional processing techniques, with examples including various forms of deposition, sputtering, etching, polishing, and so on. Moreover, the described embodiments and related methods of fabrication can be modified in various ways as will be apparent to those skilled in the art.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:
1. An acoustic resonator structure, comprising:
   an acoustic reflector disposed in or over a substrate;
   a first electrode disposed over the substrate;
   a piezoelectric layer disposed over the first electrode;
   a second electrode disposed over the piezoelectric layer;
   a frame disposed within a main membrane region, the membrane defined by an overlap between the first electrode, the piezoelectric layer, the second electrode, and the acoustic reflector, and the frame having an outer edge substantially aligned with a boundary of the main membrane region, wherein the frame is disposed at a bottom portion of the second electrode; and a collar, which is separate from the frame, disposed adjacent to the main membrane region, and the collar having an inner edge substantially aligned with the boundary of or overlapping the main membrane region.

2. The acoustic resonator structure of claim 1, further comprising an additional frame disposed within the main membrane region and having an outer edge substantially aligned with the boundary of the main membrane region, wherein the additional frame is disposed at a bottom portion of the first electrode.

3. The acoustic resonator structure of claim 1, further comprising an additional frame disposed within the main membrane region and having an outer edge substantially aligned with the boundary of the main membrane region, wherein the additional frame is disposed at a top portion of the bottom first electrode.

4. The acoustic resonator structure of claim 1, wherein the frame is an add-on frame or a composite frame.

5. The acoustic resonator structure of claim 1, wherein the collar comprises borosilicate glass, carbon-doped silicon oxide, silicon carbide, silicon nitride, aluminum oxide, aluminum nitride, zinc oxide, lead zirconium titanate, diamond or diamond-like carbon.

6. The acoustic resonator structure of claim 1, wherein the frame comprises a layer of
copper, molybdenum, aluminum, tungsten, iridium, borosilicate glass, carbon-doped silicon oxide, silicon carbide, silicon nitride, aluminum oxide, aluminum nitride, zinc oxide, lead zirconium titanate, diamond or diamond-like carbon.

7. The acoustic resonator structure of claim 1, wherein the acoustic reflector is an air cavity located below the first electrode, and the boundary of the main membrane region is defined by an edge of the second electrode above the acoustic reflector.

8. The acoustic resonator structure of claim 1, wherein the collar defines a collar region having a cutoff frequency that is substantially the same as a cutoff frequency of the main membrane region.

9. The acoustic resonator structure of claim 1, wherein the frame defines a frame region and is configured to create at least one of a cut-off frequency mismatch and an acoustic impedance mismatch between the frame region and a center portion of the main membrane region.

10. The acoustic resonator structure of claim 1, further comprising an additional frame connected to the first electrode within the main membrane.

11. The acoustic resonator structure of claim 10, wherein the frame is disposed in a first frame region and is configured to shift a cutoff frequency of the first frame region in a first direction, and wherein the additional frame is disposed in a second frame region and is configured to shift a cutoff frequency of the second frame region in a second direction opposite the first direction.

12. The acoustic resonator of claim 1, wherein the acoustic reflector is disposed between the first electrode and the substrate.

13. An acoustic resonator structure, comprising:
an acoustic stack comprising a piezoelectric layer sandwiched between first and second electrode layers and having a main membrane region defined by an overlap between the first electrode, the piezoelectric layer, the second electrode, and a substrate having an air cavity, wherein the first electrode layer is disposed over the substrate having the air cavity;
a frame disposed within the main membrane region, and between the piezoelectric layer and the second electrode layer, the frame having an outer edge substantially aligned with a boundary of the main membrane region; and
a collar disposed adjacent to the main membrane region, and between the substrate and the first electrode, the collar having an inner edge substantially aligned with the boundary of or overlapping the main membrane region,
wherein the frame and the collar are located at different layers of the acoustic stack.

14. An acoustic resonator structure, comprising:
an acoustic reflector disposed in or over a substrate
a first electrode disposed over a substrate;
a piezoelectric layer disposed over the first electrode;
a second electrode disposed over the piezoelectric layer;
a frame disposed within a main membrane region defined by an overlap between the first electrode, the piezoelectric layer, the second electrode, and the acoustic reflector, the frame having an outer edge substantially aligned with a boundary of the main membrane region; and
a collar, which is separate from the frame, disposed adjacent to the main membrane region, and the collar having an inner edge substantially aligned with the boundary of or overlapping the main membrane region, the collar being disposed between the first electrode and the piezoelectric layer, or between the first electrode and the substrate.

15. The acoustic resonator structure of claim 14, further comprising an additional frame disposed within the main membrane region and having an outer edge substantially aligned with the boundary of the main membrane region, wherein the frame is disposed at a bottom portion of the second electrode and the additional frame is disposed at a bottom portion of the first electrode.

16. The acoustic resonator structure of claim 14, further comprising an additional frame disposed within the main membrane region and having an outer edge substantially aligned with the boundary of the main membrane region, wherein the frame is disposed at a bottom portion of the second electrode and the additional frame is disposed at a top portion of the first electrode.

17. The acoustic resonator structure of claim 14, wherein the frame is an add-on frame or a composite frame.

18. The acoustic resonator structure of claim 14, wherein the collar comprises borosilicate glass, carbon-doped silicon oxide, silicon carbide, silicon nitride, aluminum oxide, aluminum nitride, zinc oxide, lead zirconium titanate, diamond or diamond-like carbon.

19. The acoustic resonator structure of claim 14, wherein the frame comprises a layer of
copper, molybdenum, aluminum, tungsten, iridium, borosilicate glass, carbon-doped silicon oxide, silicon carbide, silicon nitride, aluminum oxide, aluminum nitride, zinc oxide, lead zirconium titanate, diamond or diamond-like carbon.

20. The acoustic resonator structure of claim 14, wherein the boundary of the main membrane region is defined by an edge of the second electrode above the acoustic reflector.

21. The acoustic resonator structure of claim 14, wherein the collar defines a collar region having a cutoff frequency that is substantially the same as a cutoff frequency of the main membrane region.

22. The acoustic resonator structure of claim 14, wherein the frame defines a frame region and is configured to create at least one of a cut-off frequency mismatch and an acoustic impedance mismatch between the frame region and a center portion of the main membrane region.

23. The acoustic resonator structure of claim 14, further comprising an additional frame connected to the first or second electrode within the main membrane and arranged in a side by side configuration with the frame.

24. The acoustic resonator structure of claim 23, wherein the frame is disposed in a first frame region and is configured to shift a cutoff frequency of the first frame region in a first direction, and wherein the additional frame is disposed in a second frame region and is configured to shift a cutoff frequency of the second frame region in a second direction opposite the first direction.

25. An acoustic resonator structure, comprising:
a first electrode disposed over a substrate;
a piezoelectric layer disposed over the first electrode;
a second electrode disposed over the piezoelectric layer;
a frame disposed within a main membrane region defined by an overlap between the first electrode, the piezoelectric layer, and the second electrode, and the frame having an outer edge substantially aligned with a boundary of the main membrane region;
a collar, which is separate from the frame, disposed adjacent to the main membrane region, and the collar having an inner edge substantially aligned with the boundary of or overlapping the main membrane region; and
a planarization layer disposed over the piezoelectric layer adjacent to the second electrode, wherein the collar is disposed over the planarization layer and the second electrode.

* * * * *